(12) United States Patent
Yamashita

(10) Patent No.: US 11,882,646 B2
(45) Date of Patent: Jan. 23, 2024

(54) WIRING MODULE AND IMAGING APPARATUS

(71) Applicant: SONY SEMICONDUCTOR SOLUTIONS CORPORATION, Kanagawa (JP)

(72) Inventor: Yutaro Yamashita, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 87 days.

(21) Appl. No.: 17/623,988

(22) PCT Filed: Jul. 2, 2020

(86) PCT No.: PCT/JP2020/025944
§ 371 (c)(1),
(2) Date: Dec. 30, 2021

(87) PCT Pub. No.: WO2021/010173
PCT Pub. Date: Jan. 21, 2021

(65) Prior Publication Data
US 2022/0353984 A1 Nov. 3, 2022

(30) Foreign Application Priority Data
Jul. 12, 2019 (JP) .................................. 2019-130563

(51) Int. Cl.
*H05K 1/02* (2006.01)
(52) U.S. Cl.
CPC .................................. *H05K 1/0206* (2013.01)

(58) Field of Classification Search
CPC .................................................. H05K 1/0206
See application file for complete search history.

(56) References Cited

U.S. PATENT DOCUMENTS

| | | | |
|---|---|---|---|
| 9,781,863 B1* | 10/2017 | Kim | H05K 1/0206 |
| 10,766,431 B2* | 9/2020 | Koshiba | B60R 1/00 |
| 11,115,567 B2* | 9/2021 | Zhang | H04N 23/54 |

(Continued)

FOREIGN PATENT DOCUMENTS

| | | |
|---|---|---|
| CN | 110637361 A | 12/2019 |
| JP | 08-204072 A | 8/1996 |

(Continued)

OTHER PUBLICATIONS

International Search Report and Written Opinion of PCT Application No. PCT/JP2020/025944, dated Sep. 8, 2020, 09 pages of ISRWO.

*Primary Examiner* — Hoa C Nguyen
(74) *Attorney, Agent, or Firm* — CHIP LAW GROUP

(57) ABSTRACT

A wiring module according to an embodiment of the present technology includes: a wiring board and a heat dissipation member. The wiring board includes a body portion and one or more heat dissipation vias, the body portion including a front surface layer to which a device package is connected and a rear surface layer opposite to the front surface layer, the one or more heat dissipation vias penetrating the body portion from the front surface layer to the rear surface layer. The heat dissipation member is connected to the rear surface layer so as to thermally bond with the one or more heat dissipation vias.

19 Claims, 13 Drawing Sheets

(56) References Cited

U.S. PATENT DOCUMENTS

| | | | | |
|---|---|---|---|---|
| 2013/0256003 | A1* | 10/2013 | Duppong | H05K 1/0272 |
| | | | | 174/252 |
| 2014/0061692 | A1* | 3/2014 | Preuschl | H05K 1/0206 |
| | | | | 257/91 |
| 2015/0181698 | A1* | 6/2015 | Suganuma | H01L 27/14636 |
| | | | | 174/254 |
| 2015/0319840 | A1* | 11/2015 | Sanada | H05K 7/20854 |
| | | | | 361/709 |
| 2015/0334870 | A1* | 11/2015 | Feng | G06K 7/10811 |
| | | | | 235/462.21 |
| 2018/0331012 | A1* | 11/2018 | Shimakawa | B62D 5/0481 |

FOREIGN PATENT DOCUMENTS

| | | |
|---|---|---|
| JP | 2012-182395 A | 9/2012 |
| JP | 2014-220308 A | 11/2014 |
| JP | 2017-184035 A | 10/2017 |
| WO | 2018/216627 A1 | 11/2018 |

* cited by examiner

WIRING MODULE AND IMAGING APPARATUS

CROSS REFERENCE TO RELATED APPLICATIONS

This application is a U.S. National Phase of International Patent Application No. PCT/JP2020/025944 filed on Jul. 2, 2020, which claims priority benefit of Japanese Patent Application No. JP 2019-130563 filed in the Japan Patent Office on Jul. 12, 2019. Each of the above-referenced applications is hereby incorporated herein by reference in its entirety.

TECHNICAL FIELD

The present technology relates to a wiring module including a wiring board, and imaging apparatus.

BACKGROUND ART

In the past, a technology for dissipating heat generated by an electronic circuit has been developed. For example, Patent Literature 1 describes a multilayer board that diffuses heat of an electronic component mounted on a surface thereof. A plurality of through-vias penetrating a core layer inside the board is provided in this multilayer board. These through-vias are obliquely formed so as to spread radially from the front surface toward the rear surface. As a result, it is possible to diffuse the heat of the electronic component so as to spread outward, and promote heat transfer (paragraphs [0032], [0052], and [0053] of the specification, FIG. 3, and the like of Patent Literature 1).

CITATION LIST

Patent Literature

Patent Literature 1: Japanese Patent Application Laid-open No. 2014-220308

DISCLOSURE OF INVENTION

Technical Problem

In recent years, the performance and the size of an integrated circuit mounted on an electronic circuit, or the like have been improved and increased, respectively, and the measures for releasing the generated heat of a device are important. For this reason, a technology capable of exhibiting excellent heat dissipation is desired.

In view of the circumstances as described above, it is an object of the present technology to provide a wiring module and an imaging apparatus that are capable of exhibiting excellent heat dissipation.

Solution to Problem

In order to achieve the above-mentioned object, a wiring module according to an embodiment of the present technology includes: a wiring board; and a heat dissipation member.

The wiring board includes a body portion and one or more heat dissipation vias, the body portion including a front surface layer to which a device package is connected and a rear surface layer opposite to the front surface layer, the one or more heat dissipation vias penetrating the body portion from the front surface layer to the rear surface layer.

The heat dissipation member is connected to the rear surface layer so as to thermally bond with the one or more heat dissipation vias.

In this wiring module, one or more heat dissipation vias penetrating a body portion of a wiring board from a front surface layer to a rear surface layer are provided. A device package is connected to the front surface layer. Further, a heat dissipation member that thermally bonds with the one or more heat dissipation vias is connected to the rear surface layer. These heat dissipation vias make it possible to directly transfer the heat of the device package generated on the side of the front surface layer to the heat dissipation member on the side of the rear surface layer, and exhibit excellent heat dissipation.

The front surface layer may have a connection region to which the device package is connected. In this case, the one or more heat dissipation vias may be arranged immediately below the connection region.

The one or more heat dissipation vias may be arranged immediately below a central portion of the connection region.

The one or more heat dissipation vias may be connected to a GND.

The wiring board may include a GND film that is formed on at least one of the front surface layer or the rear surface layer and is to be connected to at least part of the one or more heat dissipation vias.

The heat dissipation member may be connected to the GND film formed on the rear surface layer.

The device package may have a terminal surface on which a plurality of connection terminals is arranged, each of the plurality of connection terminals being a signal terminal or a GND terminal. In this case, at least part of the one or more heat dissipation vias may be arranged at positions immediately below the GND terminal of the plurality of connection terminals.

The one or more heat dissipation vias may be arranged at positions other than the positions immediately below the signal terminals of the plurality of connection terminals.

The wiring board may include one or more signal vias to be electrically connected to the signal terminals.

A diameter of the heat dissipation via may be set to a value equal to or larger than a diameter of the signal via.

The wiring board may be housed in a casing. In this case, the heat dissipation member may be connected to each of the rear surface layer of the wiring board and the casing.

The casing may include an inner wall and a heat dissipation path provided to protrude from the inner wall. In this case, the heat dissipation member may be connected to the heat dissipation path.

The casing may house a different wiring board to which a different heat dissipation member is connected. In this case, the heat dissipation member and the different heat dissipation member may be connected to the heat dissipation path.

The casing may house a different wiring board to which a different heat dissipation member is connected. In this case, the heat dissipation member may be connected to the heat dissipation path. Further, the different heat dissipation member may be connected to a site of the inner wall away from a site in which the heat dissipation path is provided.

The heat dissipation member may be a heat dissipation sheet.

The one or more heat dissipation vias may each be a filled via.

The device package may be an imaging element package.

The wiring module may constitute an in-vehicle device to be mounted on a vehicle.

An imaging apparatus according to an embodiment of the present technology includes: an imaging element package; and a wiring module.

The wiring module includes a wiring board and a heat dissipation member, the wiring board including a body portion and one or more heat dissipation vias, the body portion including a front surface layer to which the imaging element package is connected and a rear surface layer opposite to the front surface layer, the one or more heat dissipation vias penetrating the body portion from the front surface layer to the rear surface layer, the heat dissipation member being connected to the rear surface layer so as to thermally bond with the one or more heat dissipation vias.

MODE(S) FOR CARRYING OUT THE INVENTION

Hereinafter, an embodiment according to the present technology will be described with reference to the drawings.

[Whole Configuration]

Figure 1A:
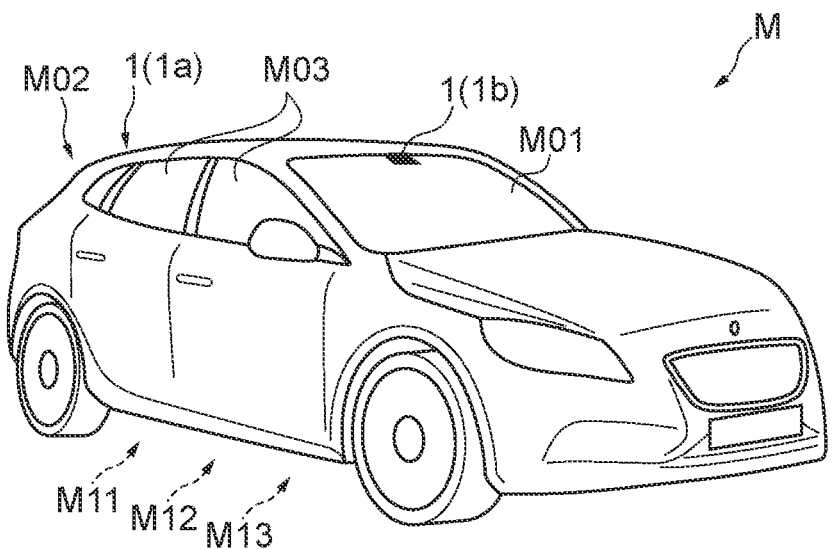
FIGS. 1A and 1B are external view of an automobile on which an in-vehicle camera according to an embodiment of the present technology is mounted.
Figure 1B:
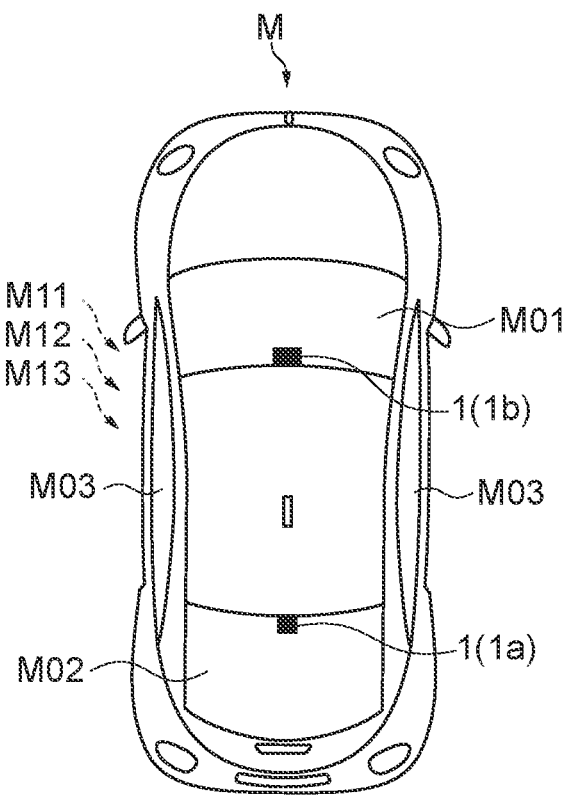

FIGS. 1A and 1B are external view of an automobile M on which an in-vehicle camera 1 according to an embodiment of the present technology is mounted. FIG. 1A is a perspective view showing a configuration example of the automobile M, and FIG. 1B are schematic diagram showing the automobile M as viewed from above. The automobile M includes, as transparent glass windows, a windshield (front window) M01 disposed in front, a rear window M02 disposed in the rear, and side windows M03 disposed on both sides.

An in-vehicle camera 1a and an in-vehicle camera 1b are mounted on the automobile M as the in-vehicle camera 1. The in-vehicle camera 1 is an example of an in-vehicle device to be mounted on a vehicle such as the automobile M.

In this embodiment, a wiring module described below is used to configure an in-vehicle device such as the in-vehicle camera 1.

The in-vehicle camera 1a a viewing camera that images the periphery of the automobile M. The in-vehicle camera 1a is mounted on, for example, the upper portion of the rear window M02 so as to image the rear of the automobile M. The image captured by the in-vehicle camera 1a is used as, for example, an image of a back monitor that shoots a scene of the rear of the automobile M.

The in-vehicle camera 1b is a front sensing camera mounted inside the windshield M01. The in-vehicle camera 1b is disposed on the upper side of the central region of the windshield M01 in the width direction. As a result, the in-vehicle camera 1b is capable of favorably imaging a scene of the front of the automobile M without obstructing the visibility of a driver.

The automobile M on which the in-vehicle camera 1 (1a and 1b) is mounted includes a driving-force generating mechanism M11, a braking mechanism M12, a steering mechanism M13, and the like therein in order to realize a traveling function, the driving-force generating mechanism M11 including an engine, a motor, and the like. Further, the automobile M may include, for example, a surrounding information detection unit for detecting surrounding information or a positioning unit for generating position information.

[Configuration of In-Vehicle Camera]

Figure 2:
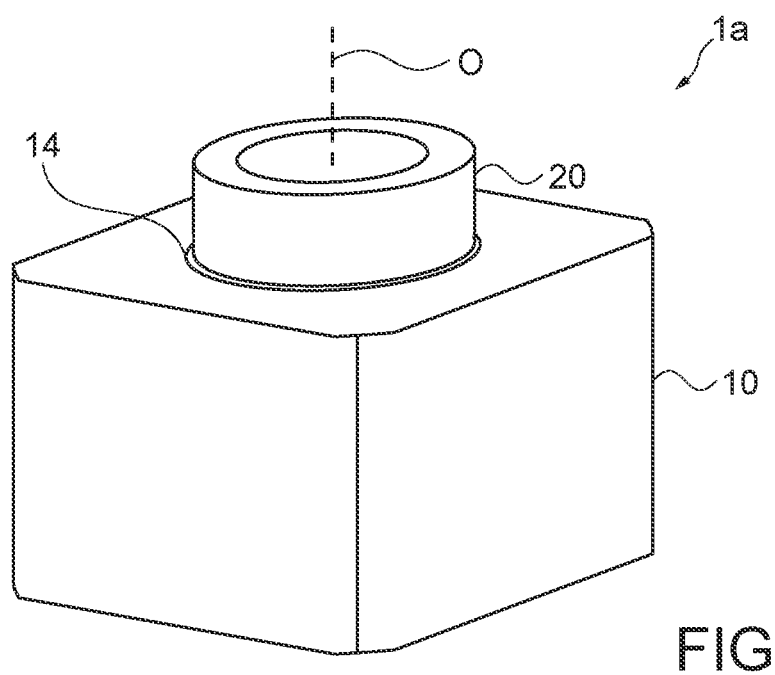
FIG. 2 is a perspective view showing the appearance of the in-vehicle camera.
Figure 3:
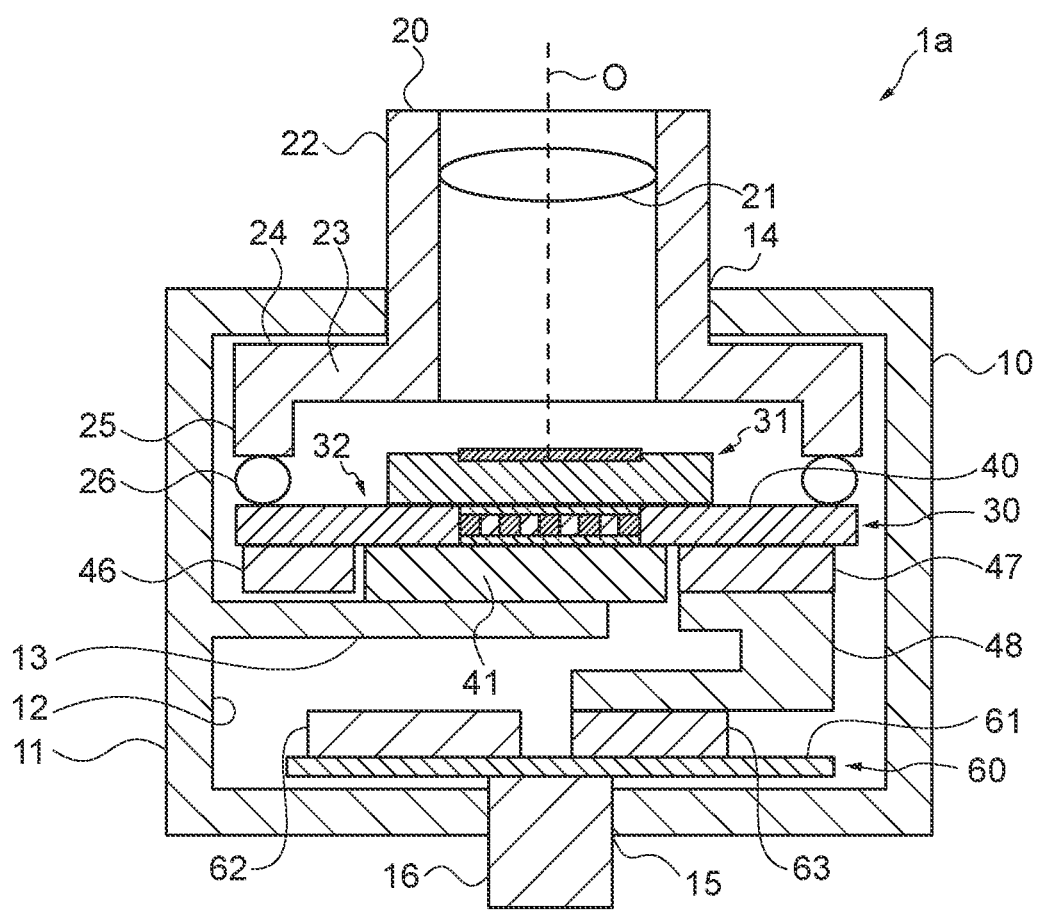
FIG. 3 is a schematic cross-sectional view showing an example of an internal structure of the in-vehicle camera shown in FIG. 2.

FIG. 2 is a perspective view showing the appearance of the in-vehicle camera 1a. FIG. 3 is a schematic cross-sectional view showing an example of an internal structure of the in-vehicle camera 1a shown in FIG. 2. The in-vehicle camera 1a includes a casing 10, a lens unit 20, an imaging unit 30, and a processing unit 60. FIG. 3 schematically illustrates the cross section of the in-vehicle camera 1a cut in a plane parallel to an optical axis O of the lens unit 20 shown in FIG. 2.

The casing 10 is a member that has a substantially rectangular parallelepiped shape and forms the outer shape of the in-vehicle camera 1a. Inside the casing 10, a space for housing a circuit such as the imaging unit 30 and the processing unit 60 is provided. For the in-vehicle camera 1a that is a viewing camera, for example, a small casing 10 having a side length of approximately 25 mm to 30 mm is used. Note that the present technology is applicable regardless of the size of the casing 10. As shown in FIG. 2 and FIG. 3, the casing 10 includes an outer wall 11, an inner wall 12, a heat dissipation path 13, a lens hole 14, and a connector hole 15.

The outer wall 11 is a wall surface of the casing 10 on the outside. A fin structure (not shown) for increasing the contact area with the outside air, or the like is provided on the outer wall 11. The inner wall 12 is a wall surface of the casing 10 on the inside. A holding mechanism (not shown) for holding the imaging unit 30, or the like is provided on the inner wall 12. Note that the casing 10 may have a single layer structure or a multilayer structure. For example, the casing 10 having a single layer structure formed of a metal material such as aluminum and stainless may be used. In this case, both the outer wall 11 and the inner wall 12 are formed of a metal material, and high heat dissipation can be exhibited. Further, for example, the casing 10 having a multilayer structure in which a plastic material is disposed outside a shield member formed of a metal material may be used. In this case, the outer wall 11 is formed of a plastic material, and the inner wall 12 is formed of a metal material. By using a plastic material, it is possible to reduce the weight of the apparatus.

The heat dissipation path 13 is provided to protrude from the inner wall 12. In the example shown in FIG. 3, the heat dissipation path 13 having a plate shape protruding from the inner wall 12 on the left side in the figure is schematically illustrated. The heat dissipation path 13 is typically formed using a metal material (aluminum, stainless, copper, or the like) to thermally bond with the inner wall 12. For example, the inner wall 12 and the heat dissipation path 13 are screwed so as to be in close contact with each other. Alternatively, the casing 10 and the heat dissipation path 13 may be integrally formed. The shape, material, and the like of the heat dissipation path 13 are not limited.

The lens hole 14 is a circular hole provided on one surface of the casing 10. The lens unit 20 described below is inserted into the lens hole 14. The connector hole 15 is a hole provided on the surface of the casing 10 opposite to the surface on which the lens hole 14 is provided. An input/output unit 16 for electrically connecting to the imaging unit 30 or the processing unit 60 housed inside the casing 10 is disposed in the connector hole 15. The input/output unit 16 is a wiring or a connector for inputting/outputting signals and supplying a power source. Note that in the casing 10, a screw hole for fixing the in-vehicle camera 1a, or the like is appropriately provided in addition to the lens hole 14 and the connector hole 15.

The lens unit 20 includes a lens optical system 21, a lens barrel portion 22, and a pedestal portion 23. The lens unit 20 is a structural member that houses the lens optical system 21 and supports the lens optical system 21 at a predetermined position. Hereinafter, the side on which the lens unit 20 is directed is referred to as the front of the in-vehicle camera 1a, and the side opposite thereto is referred to as the rear of the in-vehicle camera 1a in some cases.

The lens optical system 21 is an optical system in which a plurality of optical elements is disposed along the optical axis O, and collects incident light on a predetermined focal point inside the casing 10. FIG. 3 schematically illustrates a single lens as an example of the lens optical system 21. The specific configuration of the lens optical system 21 is not limited. For example, an arbitrary lens optical system 21 may be configured using a plurality of optical elements such as a lens, an optical aperture (aperture), and an optical filter (a polarizing filter, a wavelength-transmission filter, a wavelength-blocking filter).

The lens barrel portion 22 has a cylindrical shape, and supports the respective optical elements (lens and the like) included in the lens optical system 21 along the central axis of the cylindrical shape. Therefore, the central axis of the lens barrel portion 22 is the optical axis O of the lens optical system 21. The front end of the lens barrel portion 22 is inserted into the lens hole 14 of the casing 10, and disposed to protrude from the surface on which the lens hole 14 is provided. Note that an O-ring or the like (not shown) is provided between the casing 10 and the lens barrel portion 22 (in the lens hole 14), and maintains the airtightness of the inside of the casing 10.

The pedestal portion 23 is connected to the rear end of the lens barrel portion 22, and supports the lens barrel portion 22. That is, the pedestal portion 23 is a portion that is housed inside the casing 10 and is invisible from the outside. The pedestal portion 23 includes a support surface 24 to be connected to the lens barrel portion 22, and a side wall portion 25 disposed in the rear of the support surface 24. The support surface 24 has a substantially rectangular shape and a circular through hole centered on the optical axis O. The size of the support surface 24 is set larger than an image sensor described below. The side wall portion 25 is disposed to surround the rear surface of the support surface 24 and protrudes toward the rear, for example. Note that the side wall portion 25 may be provided so as to surround part of the rear surface of the support surface 24. The end of the side wall portion 25 opposite to the support surface 24 is adhered to a wiring board 40 described below using an adhesive 26.

Figure 4:
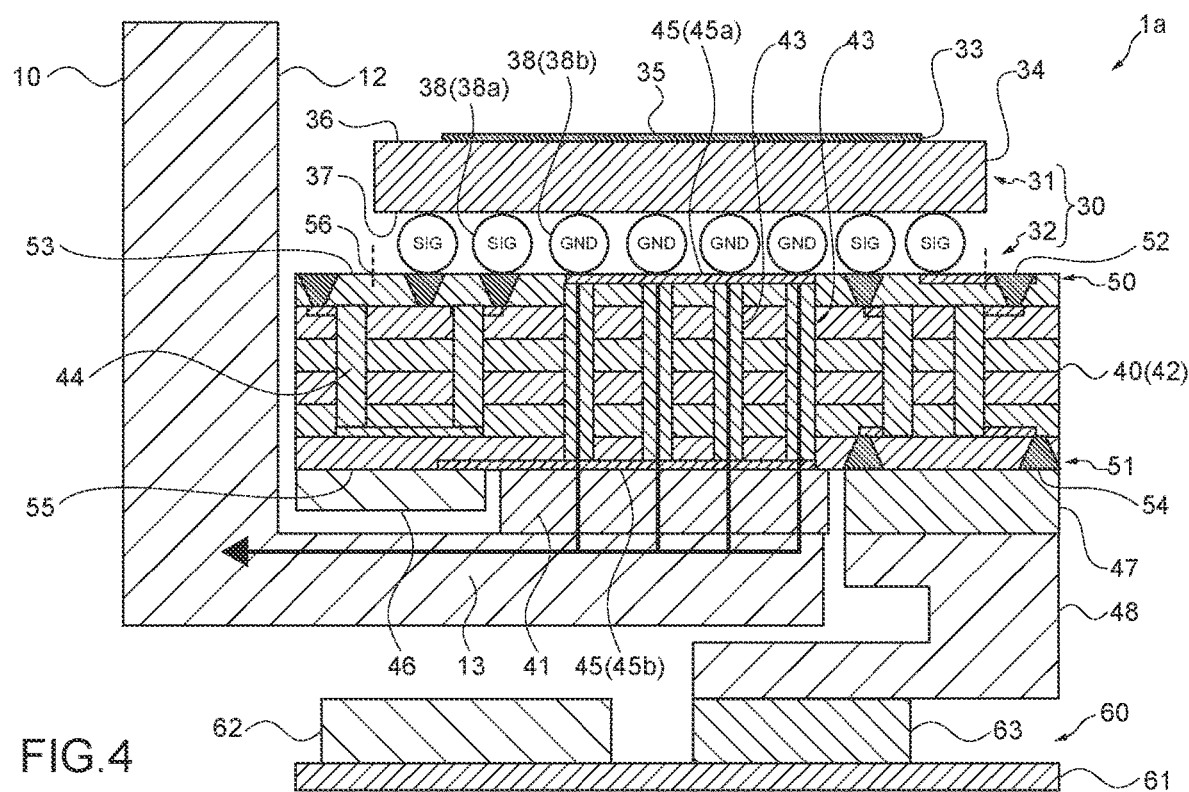
FIG. 4 is a schematic cross-sectional view showing a configuration example of an imaging unit.

FIG. 4 is a schematic cross-sectional view showing a configuration example of the imaging unit 30. The cross-sectional view shown in FIG. 4 corresponds to an enlarged view of the cross-sectional view shown in FIG. 3 centered on the imaging unit 30. Note that in FIG. 4, illustration of the lens unit 20 is omitted. The imaging unit 30 includes an image sensor 31 and a wiring module 32 to which the image sensor 31 is connected.

The image sensor 31 includes an imaging element 33 and a package board 34 and is an imaging element package on which the imaging element 33 is mounted. The imaging element 33 has an imaging surface 35 that receives light, and detects light beams that have entered the respective positions on the imaging surface 35 to generate an image signal for forming an image. Further, an electrode for outputting an image signal (not shown), or the like is appropriately provided in the imaging element 33. As the imaging element 33, a CCD element, a CMOS (Complementary Metal-Oxide Semiconductor) element, or the like is used. It goes without saying that another type of element or the like may be used. The type, resolution, and the like of the imaging element 33 are not limited. For example, the imaging element 33 according to the application of the in-vehicle camera 1a, or the like, may be appropriately used.

The package board 34 has a disposition surface 36 directed toward the front (the side of the lens unit 20) and a terminal surface 37 opposite to the disposition surface 36. The imaging element 33 is disposed on the disposition surface 36 with the imaging surface 35 directed toward the front. Further, a signal wiring (not shown) for the imaging element 33 is provided on the disposition surface 36. For example, an electrode of the imaging element 33 and a signal wiring are electrically connected to each other by a bonding wiring or the like.

A plurality of connection terminals 38 is arranged on the terminal surface 37. For example, a signal wiring connected to the imaging element 33 is connected to the corresponding connection terminal 38 via a wiring provided inside the package board 34, or the like. That is, the connection terminal 38 is a terminal for connecting to the imaging element 33. For example, the connection terminals 38 are arranged in a grid pattern on the terminal surface 37. In the example shown in FIG. 4, as the connection terminal 38, BGA (Ball Grid Array) type electrodes in which solder balls are arranged at predetermined intervals are schematically illustrated. By using the BGA type electrodes, it is possible to increase the density of the connection terminals and increase the thermal conductivity with the wiring module 32.

Each of the plurality of connection terminals 38 is a signal terminal 38a or a GND terminal 38b. The signal terminal 38a is a terminal that transmits a data signal of pixel data or the like detected by the imaging element 33, a control signal for controlling the imaging element 33, or the like. Further, the GND terminal 38b is a terminal for supplying a GND potential. In FIG. 4, the signal terminal 38a and the GND terminal 38b are respectively referred to as "SIG" and "GND". As described above, the plurality of connection terminals 38 is arranged on the terminal surface 37, each of the plurality of connection terminals 38 being the signal terminal 38a or the GND terminal 38b.

The specific configuration of the image sensor 31 is not limited. For example, a transparent cover for protecting the imaging surface 35, or the like may be provided. Further, for example, another type of terminal (pin-type terminal or the like) may be used instead of the BGA type terminal. In this embodiment, the image sensor 31 is an example of a device package. Note that the image sensor 31 can be referred to as an imager package. Hereinafter, description will be made with the imaging surface 35 of the imaging element 33 as the imaging surface 35 of the image sensor 31 in some cases.

The wiring module 32 is a mounting module to which the image sensor 31 is connected, and a wiring for the image sensor 31 is provided therein. The wiring module 32 includes the wiring board 40 and a heat dissipation sheet 41.

The wiring board 40 is a board on which the image sensor 31 is mounted, and is housed in the casing 10. The wiring board 40 is typically a dedicated board designed corresponding to the image sensor 31 to be mounted. Specifically, the layered wiring pattern to be provided on the wiring board 40 is appropriately designed in accordance with the arrangement of the connection terminal 38 of the image sensor 31, or the like. The wiring board 40 includes a board body 42, a heat dissipation via 43, a signal via 44, a GND film 45, a first mounting component 46, and a first connector 47.

The board body 42 is a body of the wiring board 40 and is configured by stacking a plurality of boards. That is, the board body 42 (the wiring board 40) is a multilayer board in which a plurality of boards is stacked. For example, glass epoxy boards in which predetermined wiring patterns are formed are stacked. Further, a via hole (a through hole via, an inner via, or the like) for connecting the wirings between the stacked boards is appropriately provided. As shown in FIG. 4, the board body 42 includes a front surface layer 50 to which the image sensor 31 is connected, and a rear surface layer 51 opposite to the front surface layer 50. In this embodiment, the board body 42 corresponds to a body portion.

The front surface layer 50 is a layer in which an electrode for connecting to the image sensor 31 (the connection terminal 38) is provided. Hereinafter, the electrode provided in the front surface layer 50 will be referred to as the front-surface electrode 52. Further, the surface to which the image sensor 31 is to be connected is referred to as the board front surface 53. Therefore, the board front surface 53 is a surface on which the front-surface electrode 52 is exposed. The front-surface electrode 52 includes an electrode to be connected to the signal terminal 38a of the image sensor 31 and an electrode to be connected to the GND terminal 38b. The electrode includes, for example, a planer pattern formed along the front surface layer 50, and a via hole penetrating the front surface layer 50. Further, also the GND film 45 described below is included in the front-surface electrode 52. The specific configuration of the front-surface electrode 52 will be described below in detail with reference to FIG. 5 and the like.

Further, as shown in FIG. 3, in this embodiment, the lens unit 20 is connected to the wiring board 40. More specifically, the side wall portion 25 that is the rear end of the lens unit 20 is connected to the outer edge portion of the board front surface 53 (the front surface layer 50) via the adhesive 26. The type and the like of the adhesive 26 are not limited. For example, a photocurable adhesive having a small linear expansion coefficient is used. Further, the wiring board 40 is fixed by a holding mechanism (not shown) provided on the inner wall 12 of the casing 10. As described above, the wiring board 40 functions also as a support member that fixes and supports the lens unit 20 and the image sensor 31 within the casing 10.

With reference to FIG. 4 again, the rear surface layer 51 is a layer in which an electrode for connecting the first mounting component 46, the first connector 47, and the like is provided. Further, the heat dissipation sheet 41 described below is connected to the rear surface layer 51. Hereinafter, the electrode provided in the rear surface layer 51 will be referred to as the rear surface electrode 54. Further, the surface to which the first mounting component 46 and the like are connected will be referred to as the board rear surface 55. Therefore, the board rear surface 55 is a surface on which the rear surface electrode 54 is exposed. The rear surface electrode 54 includes an electrode for connecting to the first mounting component 46 and the like, the GND film 45, and the like.

The heat dissipation via 43 is a via penetrating the board body 42 from the front surface layer 50 to the rear surface layer 51. The heat dissipation via 43 is typically formed of a metal material such as copper. That is, the heat dissipation via 43 penetrates the board body 42 to electrically and thermally connect the front surface layer 50 and the rear surface layer 51 to each other. A plurality of heat dissipation vias 43 is provided in the wiring board 40. In the cross section shown in FIG. 4, four heat dissipation vias 43 penetrating the board body 42 are illustrated. The number, arrangement, and the like of the heat dissipation via 43 are not limited. For example, one or more heat dissipation vias 43 may be appropriately arranged in accordance with the configuration of the connection terminal 38 of the image sensor 31, or the like.

In this embodiment, each of the plurality of heat dissipation vias 43 is a filled via. That is, the heat dissipation via 43 is a through-via in which the inside of the via hole (through hole) is filled with a metal material or the like. For example, the heat dissipation via 43 is formed by forming a through hole in the board body 42 using a drill, a laser, or the like and filling the through hole with a metal material. For filling the through hole with a metal material, metal plating such as copper plating is used. By forming the heat dissipation via 43 as a filled via, the cross-sectional area of the path for transferring heat (heat-conductive path) is increased. As a result, it is possible to increase the thermal conductivity for each of the heat dissipation vias 43. Note that the plurality of heat dissipation vias 43 may include a via that is not filled with a metal material, or the like.

Figure 5:
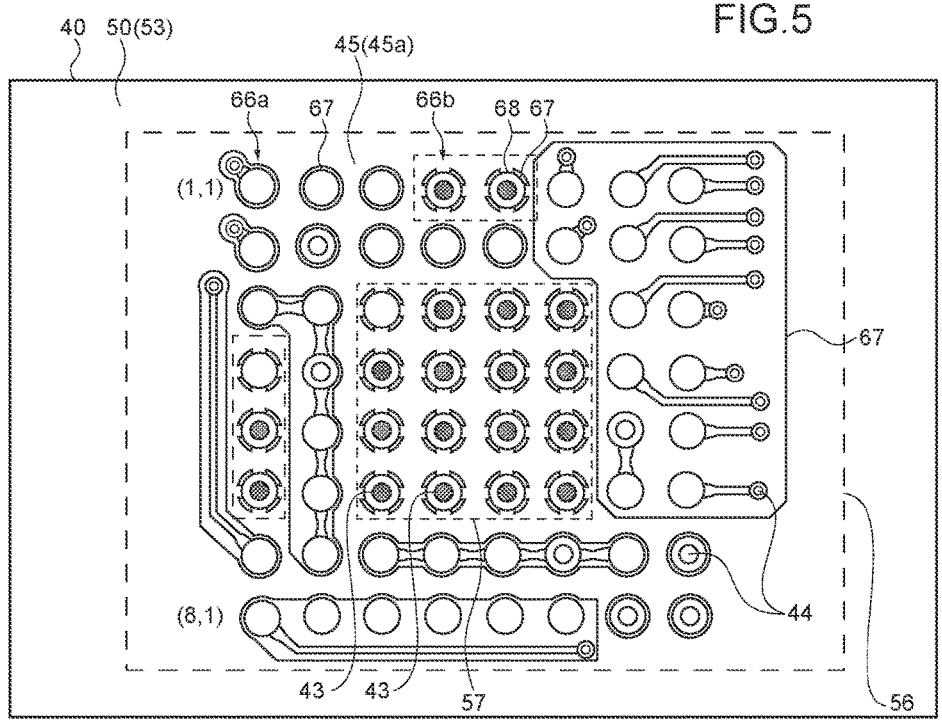
FIG. 5 is a plan view showing an example of a front-surface electrode provided in a front surface layer of a wiring board.
Figure 5:
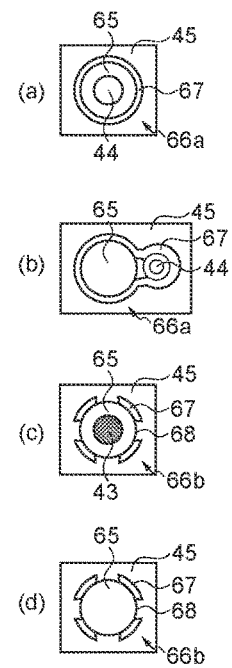

A connection region 56 to which the image sensor 31 is connected is set in the front surface layer 50 (see FIG. 5). In this embodiment, the plurality of heat dissipation vias 43 is arranged immediately below the connection region 56. Here, the term "immediately below the connection region 56" means, for example, a position overlapping with the connection region 56 when the front surface layer 50 is viewed from the front in plan view. That is, the heat dissipation vias 43 are arranged immediately below the image sensor 31, and thus, make it possible to sufficiently shorten the heat-conductive path for transferring the heat generated in the image sensor 31.

The plurality of heat dissipation vias 43 is connected to the GND. Therefore, the heat dissipation vias 43 are maintained at a predetermined GND potential, and have the same potential as each other. In other words, the heat dissipation vias 43 do not need to be electrically independent, and are connected to each other via a predetermined conductor (the GND film 45 or the like). As described above, by employing a configuration in which the heat dissipation via 43 is connected to the GND, a heat-conductive path is formed between the heat dissipation vias 43, and the whole thermal conductivity using the plurality of heat dissipation vias 43 can be enhanced.

In this embodiment, at least part of the plurality of heat dissipation vias 43 are arranged at positions immediately below the GND terminals 38*b* of the plurality of connection terminals 38. For example, in FIG. 4, four heat dissipation vias 43 are arranged immediately below four GND terminals 38*b*. As a result, the distance between the GND terminal 38*b* and the heat dissipation via 43 is shortened, and the thermal conductivity from the image sensor 31 to the heat dissipation via 43 can be enhanced. Further, the heat dissipation vias 43 may also be arranged independently of the GND terminals 38*b*.

Note that in this embodiment, the plurality of heat dissipation vias 43 are arranged at positions other than positions immediately below the signal terminals 38*a* of the plurality of connection terminals 38. That is, the heat dissipation vias 43 are not arranged immediately below the signal terminals 38*a*. As a result, it is possible to appropriately design the wiring connected to the signal terminal 38*a*. In addition, the heat dissipation vias 43 may be appropriately arranged to the extent that appropriate wiring can be performed. The specific arrangement and the like of the heat dissipation via 43 will be described below in detail with reference to FIG. 5 and the like.

The signal via 44 is a via for electrically connecting to the signal terminal 38*a* of the image sensor 31. That is, the signal via 44 functions as part of the wiring for transmitting a signal input to the signal terminal 38*a* or a signal output from the signal terminal 38*a*. A plurality of signal vias 44 is provided in the wiring board 40. In the cross section shown in FIG. 4, as an example of the signal via 44, four inner vias that are arranged inside the board body 42 and connect the stacked boards to each other are illustrated. Note that as the signal via 44, a through-via that penetrates the board body 42 to connect the front surface layer 50 and the rear surface layer 51 to each other is used in some cases. The number, arrangement, and the like of the signal via 44 are not limited. For example, one or more signal vias 44 may be appropriately arranged in accordance with the wiring pattern or the like.

The GND film 45 is a conductive film to be connected to the GND, and is typically formed of a metal material such as copper. The GND film 45 is a solid film formed so as to cover a predetermined region of the front surface layer 50 or the rear surface layer 51 of the wiring board 40. As shown in FIG. 4, the GND film 45 includes a front-surface GND film 45*a* formed on the front surface layer 50 and a rear-surface GND film 45*b* formed on the rear surface layer 51. Note that the GND film 45 may be formed on only one of the front surface layer 50 and the rear surface layer 51.

The GND film 45 is electrically connected to the corresponding heat dissipation via 43. For example, in the four heat dissipation vias 43 shown in FIG. 4, an end of each of the heat dissipation vias 43 on the side of the front surface layer 50 is connected to the front-surface GND film 45*a*, and an end of each of the heat dissipation vias 43 on the side of the rear surface layer 51 is connected to the rear-surface GND film 45*b*. Note that the heat dissipation vias 43 provided in the wiring board 40 may include those that are not connected to the GND film 45. That is, all the heat dissipation vias 43 do not necessarily need to be connected to the GND film 45.

As described above, the GND film 45 is connected to at least one of the front surface layer 50 or the rear surface layer 51, and to at least part of the plurality of heat dissipation vias 43. By providing the GND film 45 (the front-surface GND film 45*a* and the rear-surface GND film 45*b*), it is possible to maintain the plurality of heat dissipation vias 43 at a stable GND potential. Further, since the path of heat is dispersed in the heat dissipation vias 43 connected to the GND film 45, it is possible to avoid a local increase in temperature and the like.

The heat dissipation sheet 41 is a sheet member (heat-conductive sheet) that transfers heat. The heat dissipation sheet 41 is connected to the rear surface layer 51 so as to thermally bond with the plurality of heat dissipation vias 43. For example, by causing the heat dissipation sheet 41 to come into contact with the rear surface layer 51 so as to be close to the respective heat dissipation vias 43, it is possible to cause the heat dissipation sheet 41 and the heat dissipation via 43 to thermally bond with each other.

In this embodiment, the heat dissipation sheet 41 is connected to the rear-surface GND film 45*b* formed in the rear surface layer 51. That is, the heat dissipation sheet 41 thermally bonds with the plurality of heat dissipation vias 43 via the rear-surface GND film 45*b*. In this way, the contact area with the heat dissipation sheet 41, i.e., the cross-sectional area of the path for transferring heat, is ensured by passing through the rear-surface GND film 45*b*, and the heat of the heat dissipation via 43 can be effectively transferred to the side of the heat dissipation sheet 41. Note that in the case where the rear-surface GND film 45*b* is not provided, for example, the heat dissipation sheet 41 and the heat dissipation via 43 may be directly connected to each other.

Further, the heat dissipation sheet 41 is connected to the heat dissipation path 13 provided on the inner wall 12 of the casing 10. As shown in FIG. 4 and the like, one end of the heat dissipation sheet 41 is connected to the rear surface layer 51 (the heat dissipation via 43) of the wiring board 40, and the other end is connected to the heat dissipation path 13. For example, the heat dissipation sheet 41 is disposed so as to be sandwiched between the wiring board 40 and the heat dissipation path 13. Note that in the case where the heat dissipation path 13 or the like is not provided, the heat dissipation sheet 41 may be directly connected to the inner wall 12 of the casing 10. As described above, the heat dissipation sheet 41 is connected to the rear surface layer 51 of the wiring board 40 and the casing 10, and functions as a member that transfers heat between the wiring board 40 and the casing 10.

The specific configuration of the heat dissipation sheet 41 is not limited. For example, a silicon heat-conductive sheet having a predetermined thermal conductivity is used. Further, a carbon or acrylic heat-conductive sheet may be used. In this embodiment, the heat dissipation sheet 41 is an example of a heat dissipation member. Note that a different heat dissipation member may be used instead of the heat dissipation sheet 41. For example, a braided wire or the like may be used to connect the casing 10 and the wiring board 40 to each other. In addition, an arbitrary heat dissipation member capable of transferring heat of the wiring board 40 may be used.

The first mounting component 46 is an electronic component that is disposed in the rear surface layer 51 of the wiring board 40. For example, a passive element such as a resistance element, a capacitive element, and an inductor, and an electronic component such as an IC chip that performs the image sensor 31 and signal processing are connected to the rear surface electrode 54. The first connector 47 is a wiring connector to be disposed in the rear surface layer 51 of the wiring board 40. A wiring such as a flexible board 48 (FPC: Flexible Printed Circuit) is connected to the first connector 47. As described above, in addition to the heat dissipation sheet 41, an electronic component, a connector, and the like are connected to the rear surface layer 51 of the wiring board 40.

The processing unit 60 is an electric circuit that processes a signal input or output via the first connector 47, and is provided separately from the wiring board 40 in which the image sensor 31 is provided. The processing unit 60 includes a different wiring board 61 different from the wiring board 40 described above. As shown in FIG. 3, the different wiring board 61 is disposed along the inner wall 12 in which the connector hole 15 of the casing 10 is provided so as to be in the rear (lower side in the figure) of the heat dissipation path 13. Further, a second mounting component 62 and a second connector 63 are connected to the surface of the different wiring board 61 directed toward the front. The second connector 63 is connected to the first connector 47 via the flexible board 48. Further, the input/output unit 16 is connected to the surface of the different wiring board 61 directed toward the rear (inner wall). The specific configuration of the processing unit 60 is not limited.

FIG. 5 is a plan view showing an example of the front-surface electrode 52 provided in the front surface layer 50 of the wiring board 40. FIG. 5 illustrates the pattern of the front-surface electrode 52 when the front surface layer 50 (the board front surface 53) of the wiring board 40 shown in FIG. 4 is viewed from the front.

FIG. 5 shows legends of four types of electrodes (a) to (d) on the right side of the wiring board 40. The types of the electrodes will be described with reference to the electrodes (a) to (d). Each of the electrodes includes a land 65 to which a solder ball is bonded. Each connection terminal 38 (solder ball) provided on the terminal surface 37 of the image sensor 31 is connected to this land 65.

The electrode shown in Part (a) is a signal electrode 66a that is connected to the signal terminal 38a of the image sensor 31. In this electrode, the signal via 44 is provided in the center of the land 65, and is connected to the underlying wiring. Further, a ring-shaped region surrounding the land 65 is an isolation region 67 in which the GND film 45 is not provided. Therefore, the land 65 of the signal electrode 66a constitutes an electrode that is surrounded by the isolation region 67 and is not connected to the GND film 45. The electrode shown in Part (b) is a signal electrode 66a, and the signal via 44 is provided at a position different from the land 65. In this case, a wiring connecting the land 65 and the signal via 44 to each other is provided, and the isolation region 67 surrounding the path from the land 65 to the signal via 44 is provided.

The electrode shown in Part (c) is a GND electrode 66b to be connected to the GND terminal 38b of the image sensor 31. The heat dissipation via 43 (shaded area in the drawing) is arranged immediately below the land 65 that is the GND electrode 66b. Further, a connection portion 68 for connecting to the GND film 45 is provided around the land 65 of the GND electrode 66b. In the example shown in FIG. 5, four connection portions 68 arranged so as to surround the circular land 65 at equal intervals are provided, and the isolation region 67 is formed between the connection portions 68. In this way, even in the GND electrode 66b, it is possible to properly bond a solder ball by partially surrounding the land 65 with the isolation region 67. Further, the electrode shown in Part (d) is the GND electrode 66b, and is an electrode in which the heat dissipation via 43 is not provided.

In the example shown in FIG. 5, 8×8 lands 65 (electrodes) are arranged in a grid pattern at predetermined intervals in the front surface layer 50. Each of the lands 65 is the signal electrode 66a or the GND electrode 66b. Hereinafter, the upper left land 65 in the figure will be referred to as the land (1,1), and each of the lands 65 will be referred to as the land (X,Y) using the row number X and the column number Y in some cases. For example, the lower left land 65 in the figure is referred to as the land (8,1).

Further, the isolation region 67 is formed around the signal electrode 66a (electrode other than the GND electrodes 66b shown in the legends (c) and (d)) so as to surround the corresponding land 65 and the like. Then, the GND film 45 (the front-surface GND film 45a) is formed in the portion excluding the isolation region 67. Therefore, each of the signal electrodes 66a is an electrode electrically separated from the GND film 45. Further, each of the GND electrodes 66b is connected to the GND film 45.

In FIG. 5, the connection region 56 to which the image sensor 31 is connected is illustrated by a coarse dotted line. The size of the connection region 56 is similar to the size of the package of the image sensor 31. Note that the side wall portion 25 of the lens unit 20 is connected to the region outside the connection region 56 via the adhesive 26.

As shown in FIG. 5, in this embodiment, the plurality of heat dissipation vias 43 is arranged immediately below a central portion 57 of the connection region 56. Here, the central portion 57 is, for example, a region including the center of the connection region 56. For example, in the image sensor 31, the connection terminal 38 arranged near the center is often set as the GND terminal 38b. For this reason, also in the wiring board 40, many GND electrodes 66b are arranged in the central portion 57. The heat dissipation vias 43 are arranged to the extent possible immediately below these GND electrodes 66b arranged in the central portion 57. As a result, it is possible to connect a heat-conductive path having high heat dissipation to the vicinity of the center of the image sensor 31, and exhibit high heat dissipation.

For example, in FIG. 5, 4×4 lands 65 (land (X,Y), X=3 to 6, Y=3 to 6) arranged in the central portion 57 of the connection region 56 are the GND electrodes 66b. The heat dissipation vias 43 are arranged immediately below the lands 65 other than the land (3,3), of the 4×4 lands 65. Note that the land (3,3) is located at a position where it is difficult to form the heat dissipation via 43 penetrating to the rear surface layer 51 because it interferes with the internal wiring of the board body 42. As described above, even in the case where it is difficult to provide the heat dissipation via 43, it is possible to maintain high heat dissipation because each of the heat dissipation vias 43 is connected via the GND film 45.

Further, the GND terminal 38b (the GND electrode 66b) is arranged outside the central portion 57 in some cases. For example, the land (1,4) and the land (1,5) arranged at positions near the outer edge of the connection region 56 are the GND electrodes 66b away from the central portion 57. Also for such a GND electrode 66b, the heat dissipation via 43 is arranged in the case where it does not interfere with the internal wiring. Further, in the case where it does not interfere with the electrode of the front surface layer 50, it is positively connected to the GND film 45. As a result, it is possible to expand the heat-conductive path.

Note that it is difficult to connect to the GND film 45 because it interferes with the signal electrode 66a or the isolation region 67, in some cases. For example, each of the land (4,1), the land (5,1), and the land (6,1) is the GND electrode 66b around which a plurality of signal electrodes 66a is arranged. In the example shown in FIG. 5, since the adjacent isolation region 67 is away therefrom, each of the GND electrodes 66b can be connected to the GND film 45. Meanwhile, in the case where the GND electrode 66b is surrounded by the isolation region 67 and isolated, it is difficult to connect to the GND film 45 in some cases. Even in such a case, in the case where it does not interfere with the internal wiring, the heat dissipation via 43 is arranged. As a result, the GND electrode 66b that is not connected to the GND film 45 in the front surface layer 50 is connected to the GND film 45 (the rear-surface GND film 45b) provided in the rear surface layer 51, and the GND potential is maintained.

FIG. 5 illustrates the signal via 44 to be connected to the signal electrode 66a. The signal via 44 includes, for example, a through-via penetrating the board body 42 or a blind via that does not penetrate the board body 42. Further, the diameter of each signal via 44 is appropriately set in accordance with, for example, the impedance of the wiring for transporting a signal. For example, the diameter of the signal via 44 is set in accordance with the thickness of the internal wiring of the board body 42.

Meanwhile, since the heat dissipation via 43 is connected to the GND, it is wiring in which impedance matching or the like for transmitting a signal is unnecessary. For this reason, the diameter of the heat dissipation via 43 is set to be a value as large as possible so that the thermal resistance is low. Typically, the diameter of the heat dissipation via 43 is set to a value equal to or larger than the diameter of the signal via 44. Therefore, the heat dissipation via 43 is a via wiring excellent in a thermal conductivity property as compared with the signal via 44.

[Heat Dissipation Operation of Wiring Module]

FIG. 4 schematically illustrates a heat dissipation path from the image sensor 31 to the casing 10 via the wiring module 32 by a thick solid arrow. Hereinafter, the heat dissipation operation of the wiring module 32 will be described with reference to FIG. 4.

The heat generated by the operation of the image sensor 31 is transferred to the front surface layer of the wiring board 40 via the connection terminal 38 provided on the back surface (the terminal surface 37) of the package. The heat dissipation via 43 is connected immediately below the GND terminal 38a of the image sensor 31 via the front-surface GND film 45a. Therefore, the heat reaching the front surface layer 50 of the wiring board 40 is transferred through the heat dissipation via 43 to the rear surface layer 51 on the back side of the wiring board 40.

The heat reaching the rear surface layer 51 is transferred to the heat dissipation sheet 41 via the rear-surface GND film 45b. At this time, since the heat that has passed through the corresponding heat dissipation via 43 is diffused in the rear-surface GND film 45b, the heat can be transferred in the whole rear-surface GND film 45b. The heat reaching the heat dissipation sheet 41 is transferred to the casing 10 via the heat dissipation path 13. As described above, in this embodiment, it is possible to effectively transfer the heat generated in the image sensor 31 to the casing 10 via the wiring module 32. Therefore, the wiring module 32 functions as a wiring module for mounting the image sensor 31 and also as a heat dissipation module for dissipating the heat generated in the image sensor 31.

Figure 6:
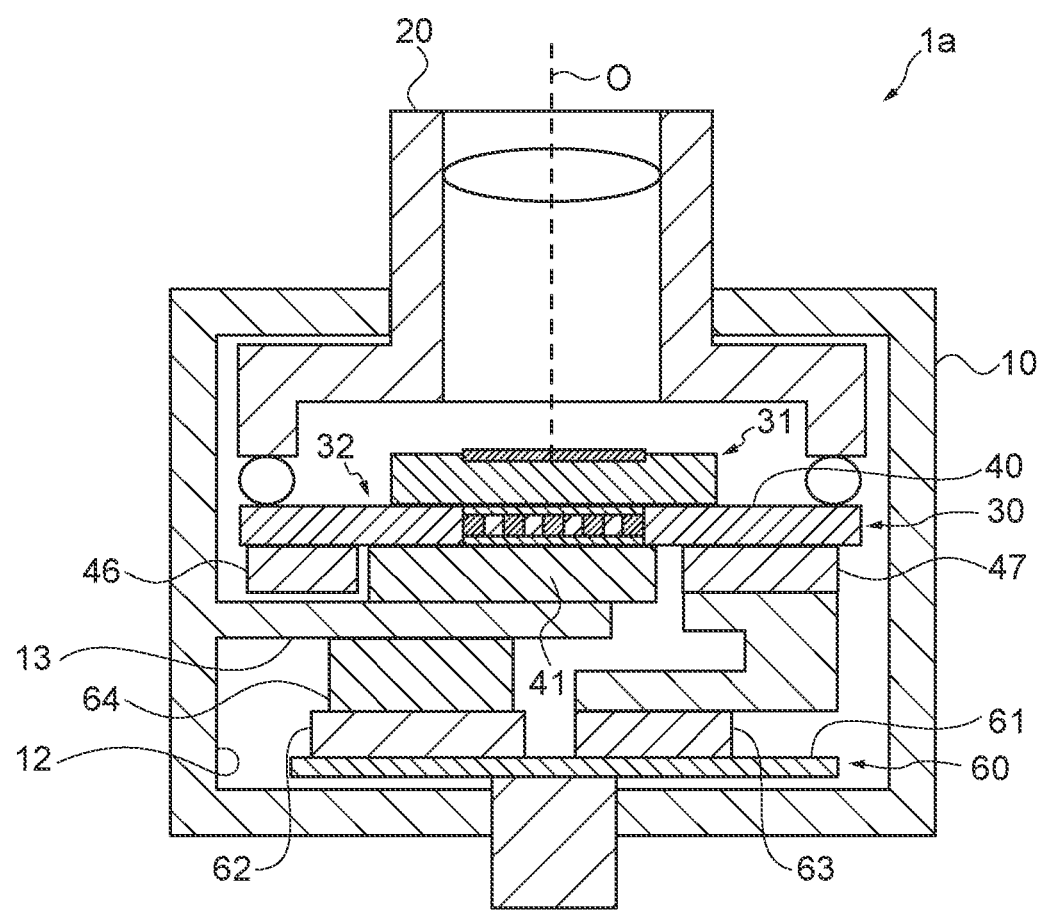
FIG. 6 is a schematic cross-sectional view showing another example of the internal structure of the in-vehicle camera shown in FIG. 2.

FIG. 6 is a schematic cross-sectional view showing another example of the internal structure of the in-vehicle camera 1a shown in FIG. 2. In the example shown in FIG. 6, a different heat dissipation sheet 64 different from the heat dissipation sheet 41 described above is connected to the different wiring board 61 constituting the processing unit 60. That is, the different wiring board 61 to which the different heat dissipation sheet 64 is connected is housed in the casing 10 of the in-vehicle camera 1a.

The different heat dissipation sheet 64 is disposed between the second mounting component 62 mounted on the different wiring board 61 and the heat dissipation path 13 to be connected to the casing 10. That is, the different heat dissipation sheet 64 forms a heat-conductive path for dissipating the heat generated in the second mounting component 62 to the casing 10. Note that also the heat dissipation sheet 41 connected to the wiring board 40 is connected to the heat dissipation path 13. That is, in the example shown in FIG. 6, the heat dissipation sheet 41 on the side of the imaging unit 30 and the different heat dissipation sheet 64 on the side of the processing unit 60 are connected to the heat dissipation path 13. As a result, it is possible to escape the heat generated in both the imaging unit 30 and the processing unit 60 to the casing 10 using the heat dissipation path 13.

In the case of the viewing camera (the in-vehicle camera 1a) as shown in FIG. 3 and FIG. 6, the size of the camera is often very small as described above. Further, the inside of the camera is hermetically sealed, and it is important how heat is escaped to the casing 10 and dissipated therefrom to the atmosphere. In this embodiment, the heat of the image sensor 31 is efficiently transferred to the back surface side by the wiring board 40 in which the heat dissipation vias 43 are arranged, and is radiated to the casing 10 via the heat dissipation sheet 41. As described above, with this configuration, it is possible to achieve efficient heat dissipation even by a small camera.

Figure 7:
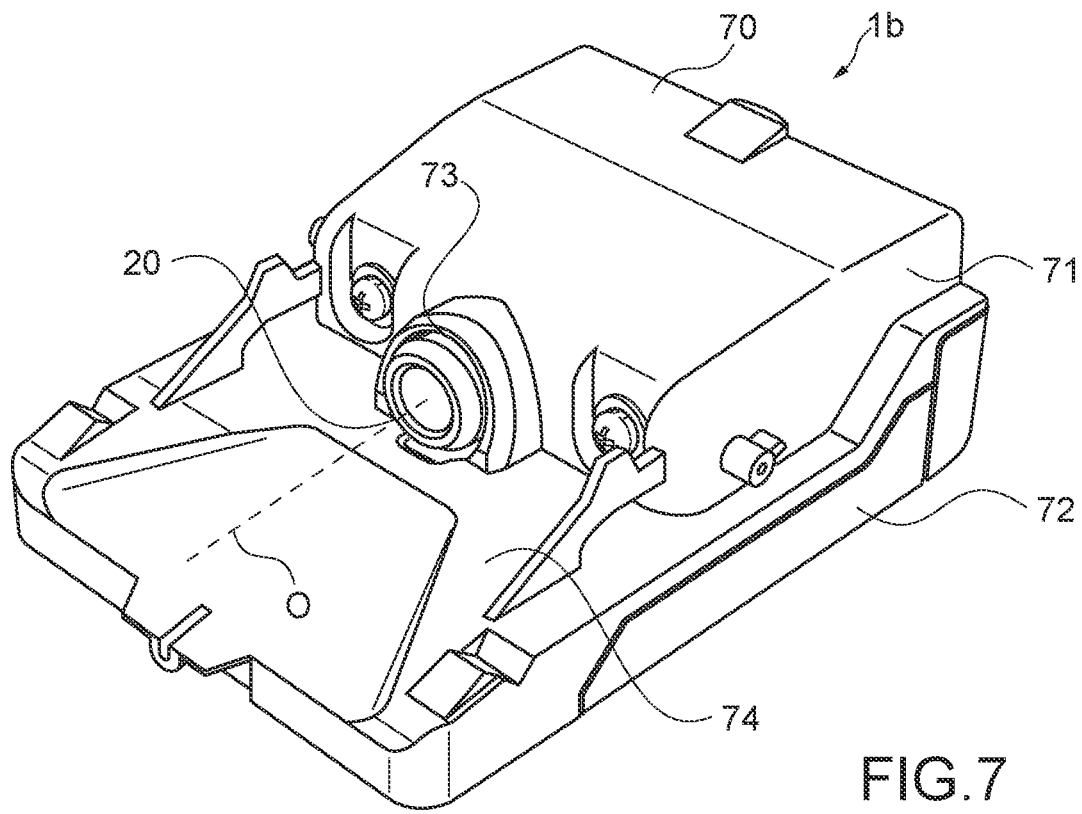
FIG. 7 is a perspective view showing a configuration example of the in-vehicle camera.
Figure 8:
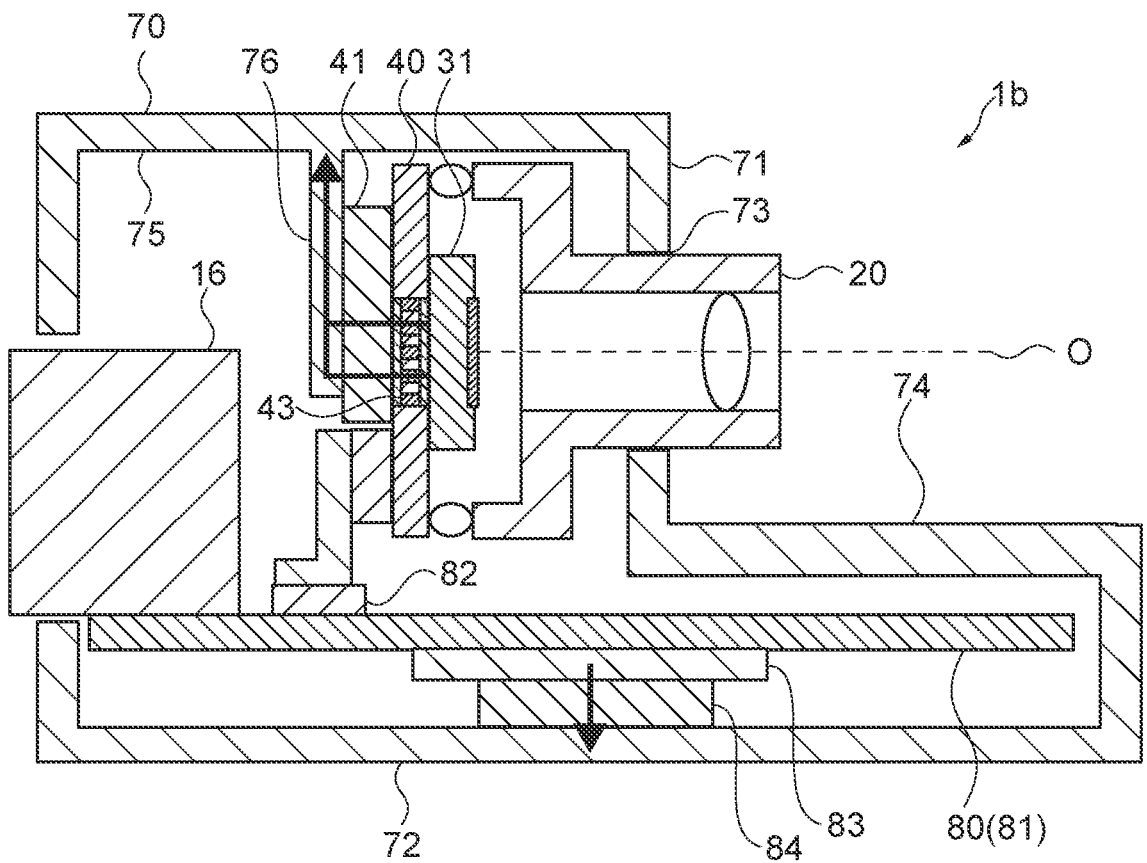
FIG. 8 is a schematic cross-sectional view showing an example of the internal structure of the in-vehicle camera shown in FIG. 7.

FIG. 7 is a perspective view showing a configuration example of the in-vehicle camera 1b. FIG. 8 is a schematic cross-sectional view showing an example of the internal structure of the in-vehicle camera 1b shown in FIG. 7. As described with reference to FIGS. 1A and 1B, the in-vehicle camera 1b is a front sensing camera mounted inside the windshield M01. The in-vehicle camera 1b is different from the in-vehicle camera 1a described above mainly in the configuration of a casing 70 and a processing unit 80.

As shown in FIG. 7, the casing 70 includes an upper case 71 and a lower case 72. In the upper case 71, a lens hole 73 to which the lens unit 20 is to be inserted is provided. The side toward which the lens unit 20 is directed is the front of the in-vehicle camera 1b. The lower case 72 is connected to the lower portion of the upper case 71, and includes a protruding portion 74 that protrudes to the front from a position where the lens hole 73 is provided.

FIG. 8 schematically illustrates the cross section of the in-vehicle camera 1b cut in a plane parallel to the optical axis O of the lens unit 20 shown in FIG. 7. The imaging unit 30 includes the image sensor 31, the wiring board 40, and the heat dissipation sheet 41, the image sensor 31 being connected to the wiring board 40, the plurality of heat dissipation vias 43 being provided in the wiring board 40, the heat dissipation sheet 41 being connected to the rear surface side of the wiring board 40. The heat dissipation sheet 41 is connected to a heat dissipation path 76 provided to protrude from an inner wall 75 of the upper case 71.

The processing unit 80 includes a different wiring board 81 different from the wiring board 40 of the imaging unit 30. The different wiring board 81 is disposed below the imaging unit 30, and is housed in the lower case 72 including the protruding portion 74. On the surface of the different wiring board 81 directed toward the imaging unit 30, a connector 82 for connecting to the imaging unit 30 and the input/output unit 16 for connecting to an external device are disposed. On the opposite surface (surface directed to the lower case 72) of the different wiring board 81, a sensing IC 83 is disposed. Further, a different heat dissipation sheet 84 to be connected to the inner wall 75 of the lower case 72 is connected to the sensing IC 83.

The sensing IC 83 is an IC that performs sensing processing on an image captured by the image sensor 31. For example, recognition processing for recognizing an automobile, a person, or the like included in the image, or distance measurement processing for measuring a distance to an object is performed. The specific operation of the sensing IC 83 will be described below in detail.

As described above, in the in-vehicle camera 1b, the wiring board 40 to which the image sensor 31 is connected and the different wiring board 81 to which the sensing IC 83 is connected are housed in the casing 70. The heat dissipation sheet 41 connected to the wiring board 40 is connected to the heat dissipation path 76 connected to the inner wall 75 of the upper case 71, and the different heat dissipation sheet 84 connected to the different wiring board 81 is connected to the inner wall 75 of the lower case 72. That is, the different heat dissipation sheet 84 is connected to a site away from a site in which the heat dissipation path 76 of the inner wall 75 is provided.

For example, the sensing IC 83 mounted on the in-vehicle camera 1b (front sensing camera) has high power consumption and the generated heat is large in some cases. For this reason, in the case where the heat of the image sensor 31 is tried to dissipate from the same position as the sensing IC 83, the temperature of the heat dissipation point becomes locally high and sufficient heat dissipation performance cannot be exhibited in some cases. Therefore, as shown in FIG. 8, by connecting the image sensor 31 and the casing to each other at a position as far as possible from the connection portion between the sensing IC 83 and the casing 70, it is possible to disperse the heat and efficiently dissipate the heat.

As described above, in the wiring module 32 according to this embodiment, the one or more heat dissipation vias 43 each penetrating the board body 42 of the wiring board 40 from the front surface layer 50 to the rear surface layer 51 are provided. The image sensor 31 is connected to the front surface layer 50. Further, the heat dissipation sheet 41 that thermally bonds with the one or more heat dissipation vias 43 is connected to the rear surface layer 51. These heat dissipation vias 43 make it possible to directly transfer the heat of the image sensor 31 generated on the side of the front surface layer 50 to the heat dissipation sheet 41 on the side of the rear surface layer 51, and exhibit excellent heat dissipation.

In recent years, it has been desired to increase the number of pixels and increase the size of an image sensor to be mounted on an in-vehicle camera or the like, and the power consumption tends to increase accordingly. Further, in order to achieve high reliability, for example, the performance capable of operating even in a high temperature environment is necessary. Meanwhile, it is demanded to increase the reliability of the apparatus while keeping the current size and shape of the apparatus. For this reason, heat dissipation of the image sensor becomes even more important.

Figure 9:
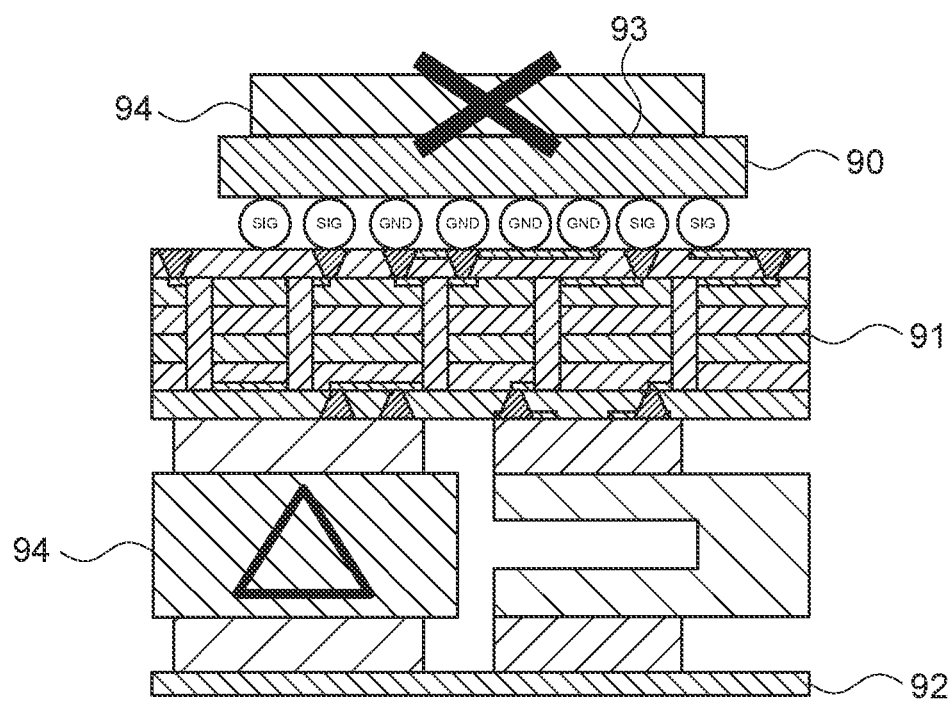
FIG. 9 is a schematic diagram showing a disposition example of a heat dissipation sheet as Comparative Example.

FIG. 9 is a schematic diagram showing a disposition example of a heat dissipation sheet as Comparative Example. FIG. 9 schematically illustrates a sensor board 91 on which an image sensor 90 is mounted, and a processing board 92 provided separately from the sensor board 91. For example, in a general IC, heat dissipation is often achieved by connecting a heat dissipation sheet, a heat sink, a fan, and the like onto a package. Meanwhile, as shown in FIG. 9, in the case of dissipating the heat of the image sensor 90, a heat dissipation sheet 94 or the like cannot be disposed on the package because an imaging surface 93 is located immediately above the package. Further, it is conceivable to dissipate heat by sandwiching the heat dissipation sheet 94 between the sensor board 91 and the processing board 92. In this case, the heat capacity of the whole circuit can be increased, but the effect of escaping the heat is limited.

Figure 10A:
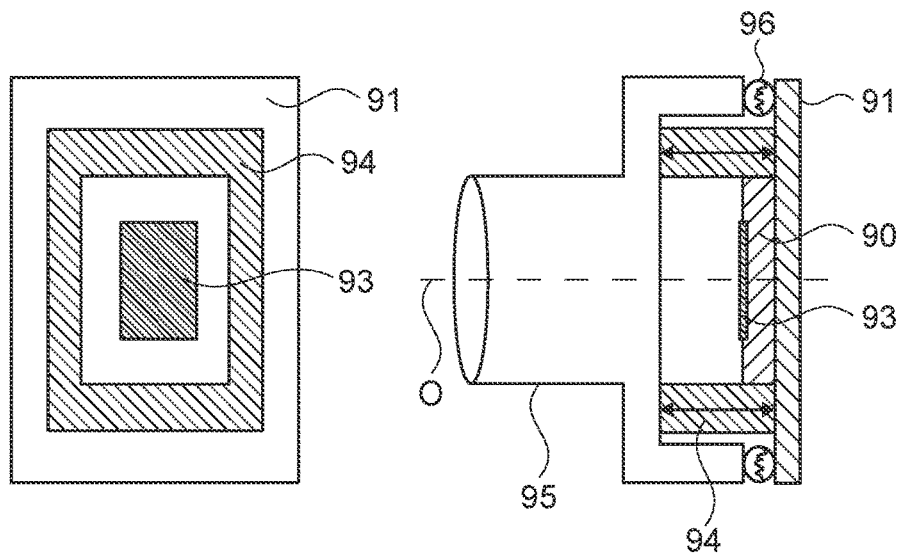
FIGS. 10A, 10B and 10C is a are schematic diagram showing another disposition example of the heat dissipation sheet as Comparative Example.
Figure 10B:
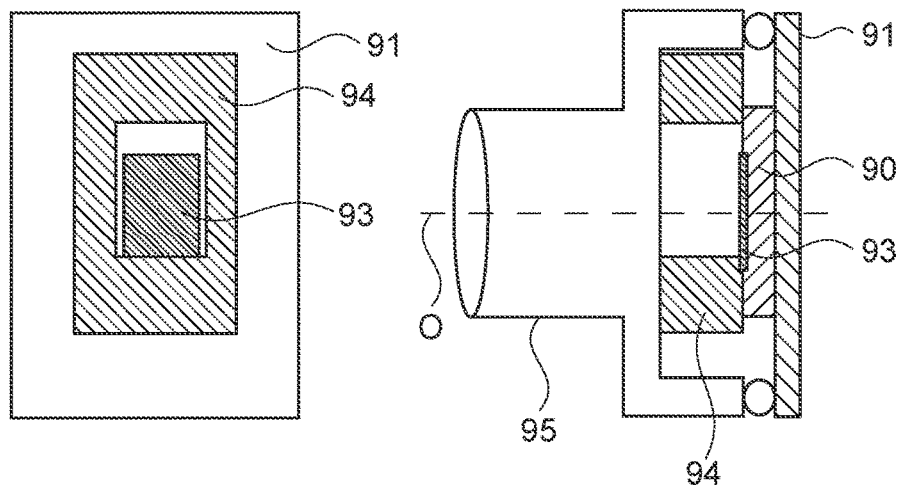
Figure 10C:
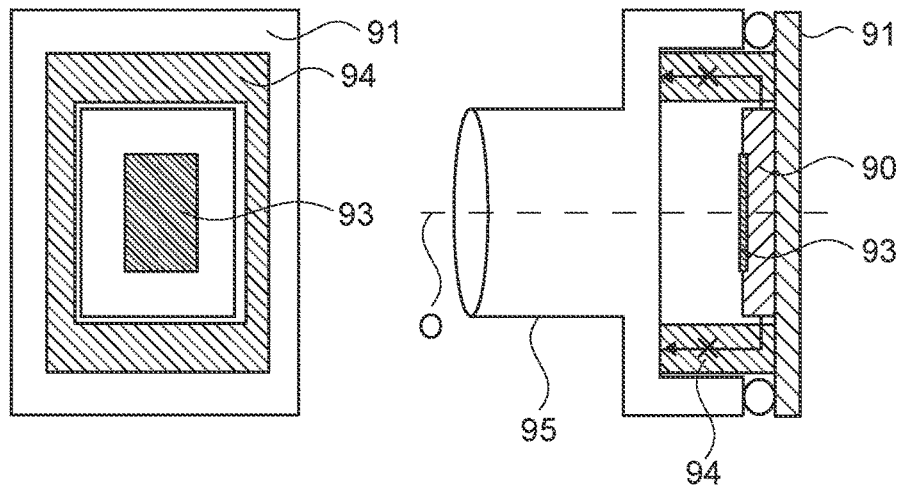

FIGS. 10A, 10B and 10C is a are schematic diagrams showing another disposition example of a heat dissipation sheet as Comparative Example. In FIGS. 10A, 10B and 10C the heat dissipation sheet 94 is disposed around the image sensor 90. The right views of FIGS. 10A, 10B and 10C are each a cross-sectional view cut in a plane parallel to the optical axis O of a lens unit 95, and the left views are each a plan view when the sensor board 91 is viewed from the front.

In FIG. 10A, the heat dissipation sheet 94 is disposed between the sensor board 91 and the lens unit 95 so as to surround the periphery of the image sensor 90. In this case, there is a possibility that an adhesive 96 is stressed by the stress of the heat dissipation sheet 94, leading to defocusing. Further, in FIG. 10B, the heat dissipation sheet 94 is disposed on the package of the image sensor 90. In this case, there is a risk that the heat dissipation sheet 94 is caught on the imaging surface 93 due to the deviation at the time of bonding or the detachment after assembling. In FIG. 10C, the heat dissipation sheet 94 is disposed around the image sensor 90 similarly to FIG. 10A, but the heat dissipation sheet 94 is not in contact with the package. For example, as shown in FIG. 10C, it is difficult to properly cause the heat dissipation sheet 94 to come into contact with the package in some cases from the viewpoint of the tolerance design. In this case, it is difficult to achieve heat dissipation performance with less variation.

Further, a configuration in which heat is escaped into the air from the front surface of the board without using a heat dissipation sheet or the like is conceivable. However, in many cases, the board of the in-vehicle camera is hermetically sealed with a casing in order to achieve dustproofing and waterproofing and is surrounded by a casing in order to suppress unnecessary radiation. For this reason, even if the heat is dissipated into the air around the board, the heat is enclosed inside the casing and cannot be effectively dissipated. Further, in the in-vehicle camera, a component is often mounted also on the rear surface of the image sensor for miniaturization, and it is difficult to provide a heat dissipating structure on the board front surface.

In this embodiment, the heat dissipation vias 43 each penetrating the board body 42 are provided in the wiring board 40 to which the image sensor 31 that is a device package is connected. As a result, it is possible to efficiently escape the heat generated in the image sensor 31 into the opposite surface (the rear surface layer 51) of the wiring board 40. For this reason, for example, there is no need to dispose the heat dissipation sheet 41 or the like around the image sensor 31, and it is possible to configure an imaging unit having high reliability.

Further, on the opposite surface, the heat dissipation vias 43 are connected to the solid GND (the rear-surface GND film 45b). This exposed rear-surface GND film 45b is connected to the casing 10 via the heat dissipation sheet 41 to form a heat-conductive path from the image sensor 31 to the casing 10. As described above, by combining the heat dissipation via 43 and the heat dissipation sheet 41, a heat-conductive path that does not interfere with another component is realized. As a result, it is possible to achieve effective heat dissipation in the image sensor 31 in which a heat dissipation sheet and a heat sink cannot be installed on a package.

By using this configuration, it is possible to effectively escape the heat generated in the image sensor 31 or the like into a casing even in a very small apparatus with the inside hermetically sealed as in the in-vehicle camera 1. Further, as described with reference to FIG. 8 and the like, even in the case where another heat generation source such as the sensing IC 83 is mounted, it is possible to reliably escape the heat generated in the image sensor 31 and the sensing IC 83 into the casing by appropriately setting the connection destination of the heat dissipation sheet 41.

For example, in the case where the temperature of the wiring board 40 or the like rises due to the heat generation of the image sensor 31, there is a possibility that the distance between the lens optical system 21 and the imaging surface 35 is shifted due to the difference of the linear expansion coefficient for each member, or the like. In the in-vehicle camera 1, a lens having a low F value is often used in order to increase the amount of received light to improve the sensitivity. As the number of pixels of the image sensor 31 has increased (e.g., several mega pixels) and the pitch has been narrowed in recent years (e.g., approximately 2 μm), the depth of the focal point set in the lens optical system 21 has become shallower.

For this reason, even if the distance between the lens optical system 21 and the imaging surface 35 is shifted by only several μm, there is a possibility that the resolution of an image deteriorates. Further, in the case of using an image with the reduced resolution, for example, it is considered that the detection accuracy of a distant object or the like in which the size is reduced in an image, the distance measurement accuracy in measuring the distance to an object, and the like are reduced. As described above, in the case where the generated heat cannot be properly escaped, the accuracy of the image itself or the accuracy of recognition processing using an image deteriorates in some cases.

Meanwhile, in this embodiment, it is possible to effectively dissipate the heat generated in the image sensor 31 into the outside of the casing 10 without being enclosed in the inside of the casing 10. That is, it is possible to sufficiently avoid the situation in which the heat is enclosed inside the casing 10. As a result, the thermal expansion or the like of each member housed in the casing 10 is relaxed, and the shifting of the imaging surface 35 described above is suppressed. As a result, it is possible to realize the highly-reliable in-vehicle camera 1 capable of continuously performing imaging with high accuracy for a long time. Further, it is possible to perform image recognition or the like using the in-vehicle camera 1 with stable accuracy.

[Drive Control System 100]

(Brief Description)

A drive control system 100 according to an embodiment of the present invention is a system for controlling the driving of the automobile M using an in-vehicle camera on which the wiring module 32 described above is mounted. Specifically, the drive control system 100 uses an image captured by the in-vehicle camera to control the driving-force generating mechanism M11, the braking mechanism M12, the steering mechanism M13, and the like of the automobile M. For such control, typically, the in-vehicle camera 1b that is a front sensing camera is used. Note that the in-vehicle camera 1a that is a viewing camera, or the like can be used.

In addition, in the drive control system 100, an arbitrary imaging module including the wiring module 32 described above is used. Here, the imaging module is a module capable of capturing an image, and is housed in, for example, a predetermined casing for use. For example, in the in-vehicle camera 1, a module in which the lens optical system 21 and the image sensor 31 are mounted on the wiring module 32 is an imaging module.

The drive control system 100 may have a configuration corresponding to a function necessary for the automobile M. Specifically, examples of the function that can be implemented by the drive control system 100 include a driving assistance function and an autonomous driving function. A configuration of the drive control system 100 capable of implementing the driving assistance function and the autonomous driving function will be described below.

(Driving Assistance Function)

The driving assistance function is typically a function of an ADAS (Advanced Driver Assistance System) including collision avoidance, shock mitigation, following driving (maintaining a following distance), vehicle speed maintaining driving, a warning of collision, a warning of deviation from a lane, and the like. The drive control system 100 may be configured such that these driving assistance functions can be implemented.

Figure 11:
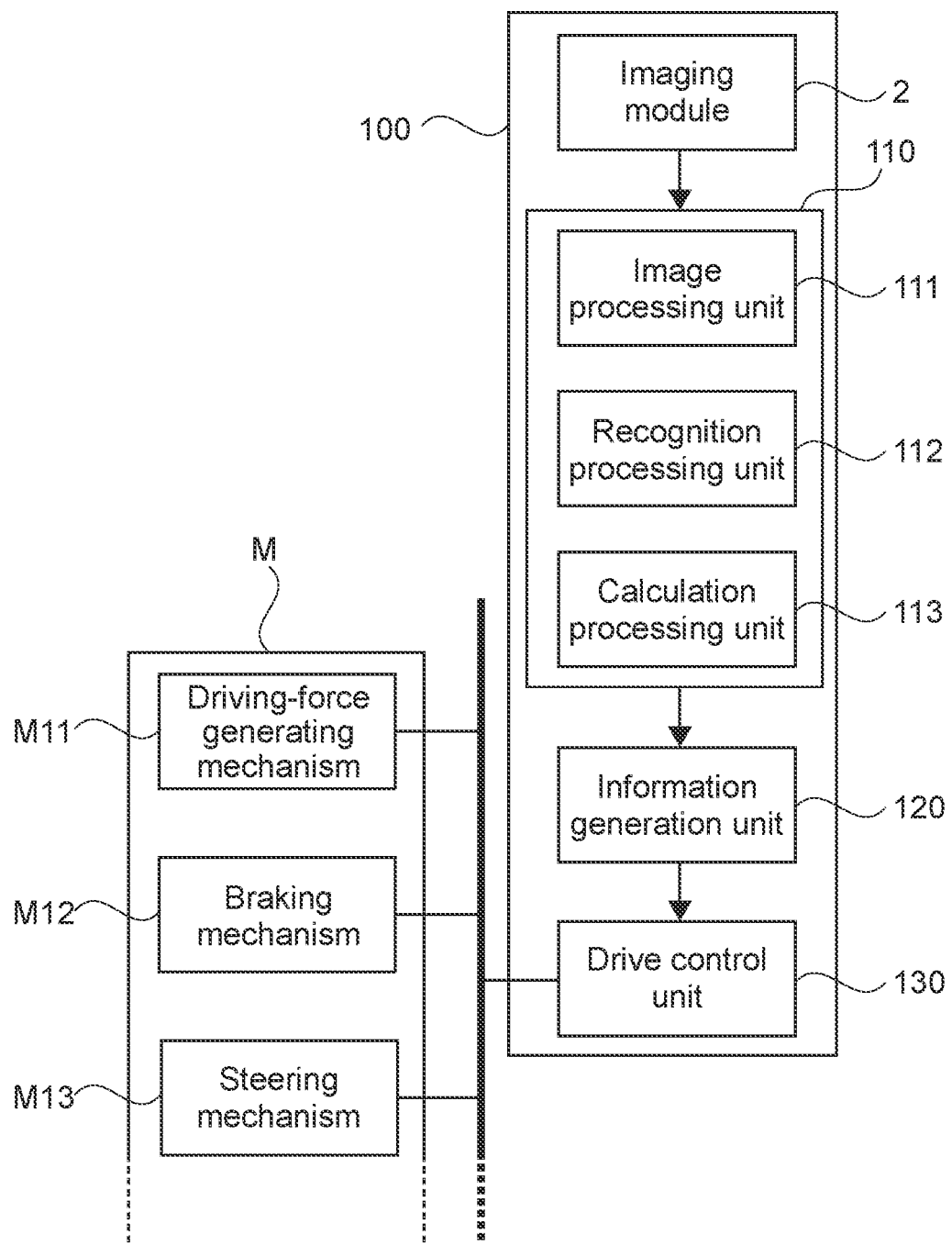

FIG. 11 is a block diagram showing a configuration of the drive control system 100 capable of implementing the driving assistance function. The drive control system 100 includes an imaging module 2, a processing unit 110, an information generation unit 120, and a drive control unit 130. The imaging module 2 includes the wiring module 32 and functions as an imaging means that images the periphery of the automobile M. The processing unit 110 includes an image processing unit 111, a recognition processing unit 112, and a calculation processing unit 113 as functional blocks.

The drive control system 100 includes a control device housed in a predetermined casing, for example. Alternatively, the respective blocks configured as separate devices may be connected to each other to configure the drive control system 100. For example, the imaging module 2 and other blocks may be housed in the same casing, or only the imaging module 2 may be housed in another casing. Further, for example, the sensing IC 83 described with reference to FIG. 8 and the like may be used as the processing unit 110. In this case, the information generation unit 120 or the drive control unit 130 may be configured using another arithmetic logic unit or may be configured using the sensing IC 83. In addition, the specific configuration of the drive control system 100 is not limited.

The respective configurations of the drive control system 100 is connected to each other through a communication network. This communication network may be, for example, an in-vehicle communication network that conforms to an arbitrary standard, such as a CAN (Controller Area Network), a LIN (Local Interconnect Network), a LAN (Local Area Network), and a FlexRay (registered trademark).

Figure 12:
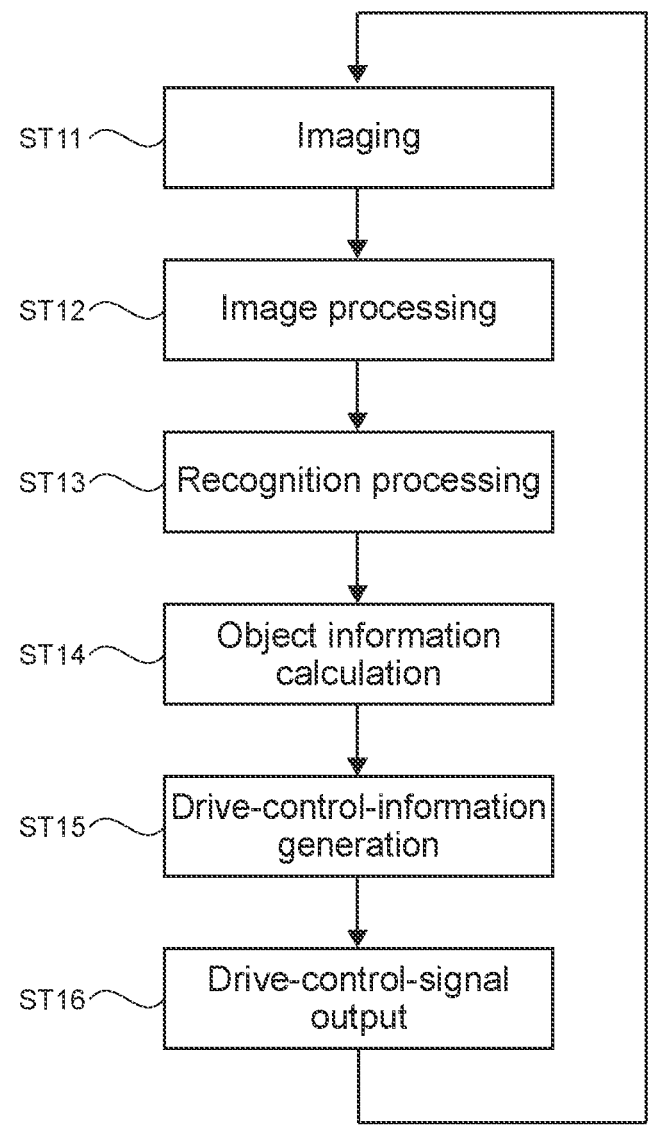

FIG. 12 is a flowchart showing a drive control method according to the drive control system 100 shown in FIG. 11. The drive control method shown in FIG. 12 includes an imaging step ST11, an image processing step ST12, a recognition processing step ST13, an object information calculation step ST14, a drive-control-information generation step ST15, and a drive-control-signal output step ST16.

In the imaging step ST11, the imaging module 2 images a scene of the front of the automobile M through the windshield M01 to generate a raw image. Since the heat generated in an image sensor and the like is effectively dissipated in the imaging module 2 configured using the wiring module 32, it is possible to capture an image with high resolution in which the effect of thermal expansion or the like is suppressed, or the like. The imaging module 2 transmits the raw image to the processing unit 110 by, for example, an in-vehicle communication unit including the input/output unit 16.

The processing unit 110 typically includes an ECU (Electronic Control Unit), and processes the raw image generated by the imaging module 2. More specifically, in the processing unit 110, the image processing unit 111 performs the image processing step ST12, the recognition processing unit 112 performs the recognition processing step ST13, and the calculation processing unit 113 performs the object information calculation step ST14. Note that the processing unit 110 may be configured such that at least part of such processing is executed by a dedicated circuit individually provided.

In the image processing step ST12, the image processing unit 111 performs image processing on the raw image to generate a processing image. The image processing performed by the image processing unit 111 is typically processing for making it easy to recognize an object in the raw image. Examples thereof include automatic exposure control, automatic white-balance adjustment, and high dynamic range combining.

In the recognition processing step ST13, the recognition processing unit 112 performs recognition processing on the processing image to recognize an object in the processing image. Note that the object recognized by the recognition processing unit 112 is not limited to a three-dimensional object. Examples thereof include a vehicle, a pedestrian, an obstacle, a traffic light, a traffic sign, a lane of a road, and a curb.

In the calculation processing step ST14, the calculation processing unit 113 calculates object information regarding an object in the processing image. Examples of the object information calculated by the calculation processing unit 113 include the shape of an object, the distance to an object, and the movement direction and the movement speed of an object. The calculation processing unit 113 uses a plurality of temporally-consecutive processing images to calculate dynamic object information.

Figure 13:
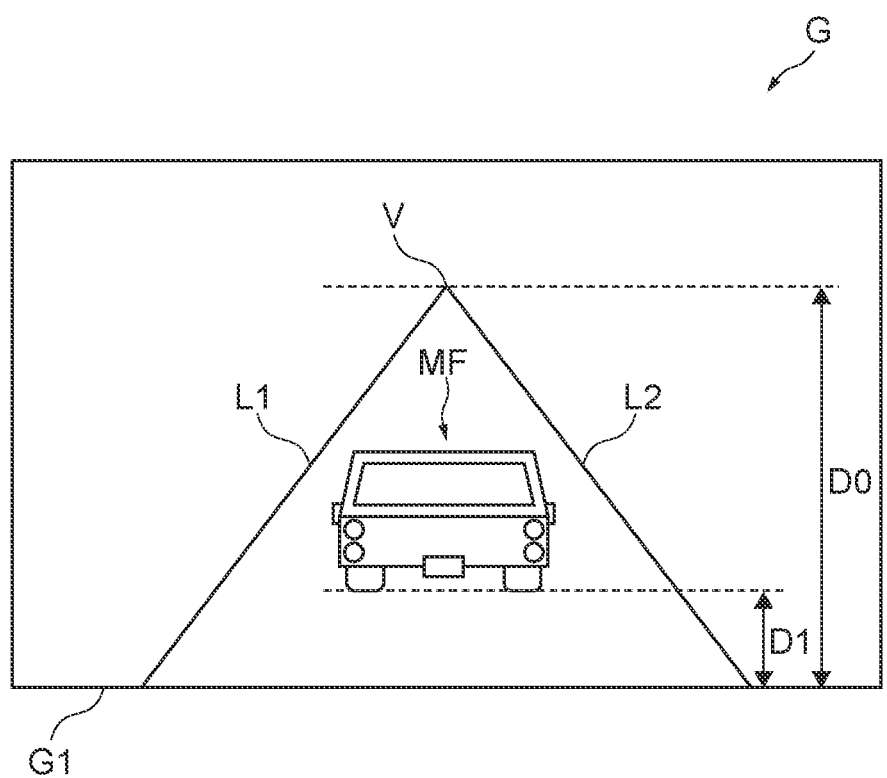

As an example of the method of calculating the object information by the calculation processing unit 113, a method of calculating the following distance to a preceding vehicle MF will be described. FIG. 13 shows an example of a processing image G generated by the image processing unit 111. In the processing image G shown in FIG. 13, the preceding vehicle MF and two lanes L1 and L2 defining driving lanes are shown.

First, a vanishing point V at which the two lanes L1 and L2 intersect is obtained in the processing image G. Note that the vanishing point V may be obtained from another object without using the lanes L1 and L2. For example, the calculation processing unit 113 may also obtain the vanishing point V using, for example, a curb, or a movement trajectory of a fixed object such as a traffic sign in a plurality of processing images.

Next, a distance D0 from a lower edge portion G1 of the processing image to the vanishing point V and a distance D1 from the lower edge portion G1 to the preceding vehicle MF of the processing image are obtained. Here, the distance D0 and the distance D1 are dimensions in the vertical direction of the processing image, and represent the vertical positions of the vanishing point V and the preceding vehicle MF in the processing image with the lower edge portion G1 as a reference. The following distance to the preceding vehicle MF can be obtained using the distances D0 and D1. For example, the use of a ratio between the distance D0 and the distance D1 makes it possible to calculate the following distance to the preceding vehicle MF.

As described above, the actual distance (the following distance or the like) to an object is calculated on the basis of the pixel position of an object in the image (processing image) captured by the imaging module 2. In this case, for example, if processing is performed using an image that is not in focus, the detection position of an object is shifted, and thus, there is a possibility that the accuracy of the calculated distance deteriorates. Meanwhile, in the imaging module 2 on which the wiring module 32 according to the present technology is mounted, excellent heat dissipation is exhibited, and thus, it is possible to sufficiently avoid the focal deviation corresponding to the thermal expansion or the like. As described above, the present technology is particularly suitably applied to a camera that captures an image used for the image processing described above.

The processing unit 110 transmits, to the information generation unit 120, data including the processing image and the object information that are obtained in Steps ST12 to ST14. Note that the processing unit 110 is not limited to the configuration described above, and may include, for example, a configuration other than the image processing unit 111, the recognition processing unit 112, and the calculation processing unit 113.

In the drive-control-information generation step ST15, the information generation unit 120 generates drive control information including the driving content necessary for the automobile M. More specifically, the information generation unit 120 determines, on the basis of the data transmitted from the processing unit 110, the driving content to be executed by the automobile M, and generates drive control information including this driving content.

Examples of the drive content of the automobile M include a change in speed (acceleration and deceleration) and a change in traveling direction. As a specific example, the information generation unit 120 determines that the automobile M needs to decelerate in the case where the following distance between the automobile M and the preceding vehicle MF is small, and determines that the automobile M needs to change the traveling direction toward a lane center in the case where the automobile M is likely to deviate from its lane.

The information generation unit 120 transmits the drive control information to the drive control unit 130. Note that the information generation unit 120 may generate information other than the drive control information. For example, the information generation unit 120 may detect the brightness in the ambient environment from a processing image, and generate, in the case where it is dark in the ambient environment, information regarding illumination control for turning on a headlight of the automobile M.

In the drive-control-signal output step ST16, the drive control unit 130 outputs a drive control signal based on the drive control information. For example, the drive control unit 130 is capable of accelerating the automobile M by the driving-force generating mechanism M11, decelerating the automobile M by the braking mechanism M12, and changing the traveling direction of the automobile M by the steering mechanism M13.

(Autonomous Driving Function)

The autonomous driving function is a function of autonomously driving the automobile M without an operation being performed by a driver. In order to implement the autonomous driving function, there is a need for more sophisticated rive control than that in the driving assistance function. The drive control system 100 is capable of more accurately executing sophisticated drive control capable of implementing the autonomous driving function by using the imaging module 2 capable of generating a raw image with high image quality.

Figure 14:
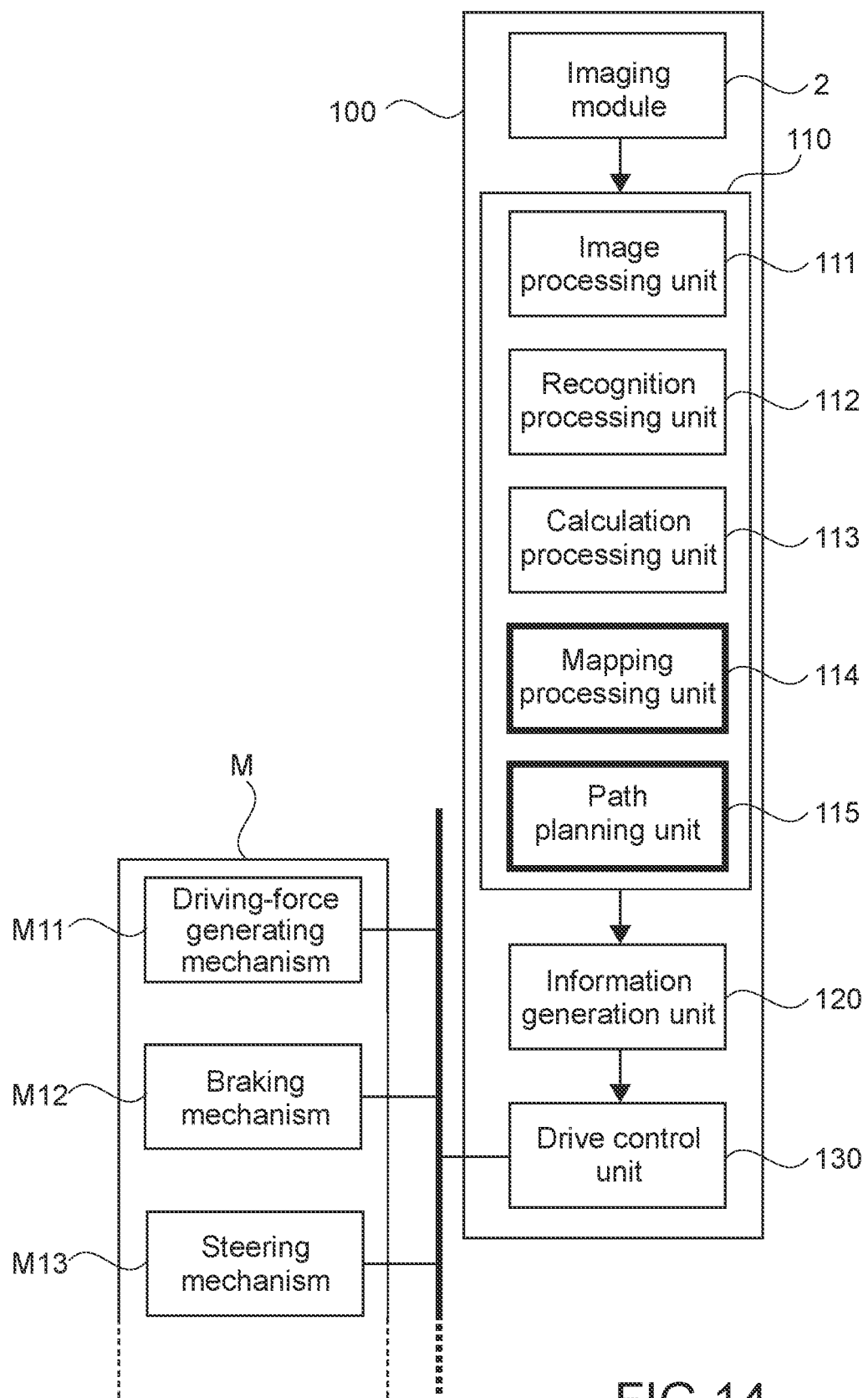

FIG. 14 is a block diagram showing a configuration of the drive control system 100 capable of achieving an autonomous driving function. This drive control system 100 further includes a mapping processing unit 114 and the path planning unit 115 included in the processing unit 110 in addition to the configurations shown in FIG. 11. Description of configurations similar to the configurations shown in FIG. 11 will be appropriately omitted below.

Figure 15:
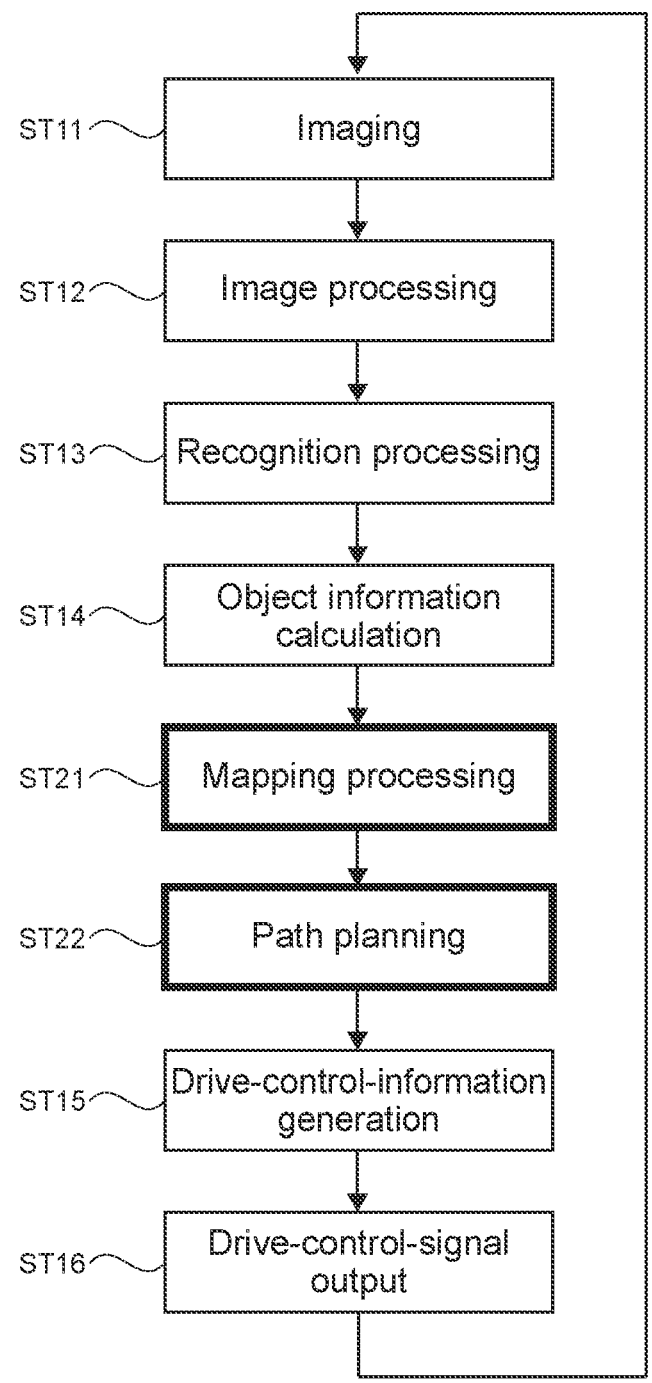

FIG. 15 is a flowchart showing a drive control method by the drive control system 100 shown in FIG. 14. The drive control method shown in FIG. 15 includes, in addition to the respective steps shown in FIG. 12, a mapping processing step ST21 by the mapping processing unit 114 and a path planning step ST22 by the path planning unit 115.

As shown in FIG. 15, the mapping processing step ST21 and the path planning step ST22 are executed between the object information calculation step ST14 and the drive-control-information generation step ST15. The path planning step ST22 is executed after the mapping processing step ST21.

In the mapping processing step ST21, the mapping processing unit 114 performs spatial mapping using a processing image and object information to create a digital map. The digital map created by the mapping processing unit 114 is a three-dimensional map created by combining static information and dynamic information that are necessary for autonomous driving.

In the drive control system 100, since a raw image of high image quality can be obtained by the imaging module 2, a high-definition digital map can be created by the mapping processing unit 114. Note that the mapping processing unit 114 is capable of generating a digital map with a larger amount of information by acquiring information other than the raw image by the imaging module 2.

For example, the mapping processing unit 114 is capable of acquiring information from a surrounding information detection unit and a positioning unit included in the automobile M, or the like. Further, the mapping processing unit 114 is capable of acquiring various types of information by performing communication with various apparatuses located in the external environment via a vehicle-exterior communication unit that makes it possible to perform vehicle-exterior communication.

The surrounding information detection unit includes, for example, an ultrasonic sensor, a radar device, or a LIDAR (Light Detection and Ranging, Laser Imaging Detection and Ranging) device. The mapping processing unit 114 is capable of acquiring, from the surrounding information detection unit, information of the rear and the side of the automobile M, which is difficult to obtain from the imaging module 2 directed toward the front, for example.

The positioning unit is configured to be capable of receiving, for example, a GNSS (Global Navigation Satellite System) signal (e.g., a GPS (Global Positioning System) signal from a GPS satellite) from a GNSS satellite to perform positioning. The mapping processing unit 114 is capable of acquiring information regarding the position of the automobile M from the positioning unit.

The vehicle-exterior communication unit can be configured to use, for example, GSM (registered trademark) (Global System of Mobile communications), WiMAX (registered trademark), LTE (registered trademark) (Long Term Evolution), LTE-A (LTE-Advanced), a wireless LAN (referred to also as Wi-Fi (registered trademark)), or Bluetooth (registered trademark).

In the path planning step ST22, the path planning unit 115 executes path planning for determining the traveling route of the automobile M using the digital map. Examples of the path planning include various types of processing such as detection of an empty space on a road, and prediction of the movement of an object such as a vehicle and a human.

After the path planning step ST22, the processing unit 110 collectively transmits, to the information generation unit 120, data including the digital map and a result of the path planning that are obtained in Steps ST21 and ST22, in addition to the data including the processing image and the object information that are obtained in Steps ST12 to ST14.

In the drive-control-information generation step ST15, the information generation unit 120 generates drive control information including the drive content for causing the automobile M to travel along a traveling route according to the path planning determined in the path planning step ST22. The information generation unit 120 transmits the generated drive control information to the drive control unit 130.

In the drive-control-signal output step ST16, the drive control unit 130 outputs a drive control signal based on the drive control information. That is, the drive control unit 130 controls driving of the driving-force generating mechanism M11, the braking mechanism M12, the steering mechanism M13, and the like such that the automobile M is capable of safely traveling along a traveling route according to the path planning.

In the case of using the image captured by the imaging module 2 to perform processing such as object position detection, ranging, map creation, and path planning, there is a possibility that the processing accuracy is reduced if an image that is not in focus is used. Meanwhile, by using the present technology, the focal deviation due to thermal expansion or the like is greatly suppressed and it is possible to provide an image with high accuracy. As described above, the present technology is particularly suitable to be applied to a camera that captures an image used for the processing as described above.

The wiring module according to the present technology can be applied to image sensors of various specifications and boards corresponding thereto. In particular, it is suitable for a camera in which an image sensor is mounted, the size of the length×width of the imaging surface of the image sensor being 4.32 mm×8.64 mm (1/1.7 type), the number of pixels of the image sensor being several mega pixels or more (particularly, 7 mega pixels or more), the camera including an optical system having the allowable range of the focal deviation of ±several μm (e.g., ±3 μm). Further, it is suitable for a camera in which an image sensor is mounted, the density of pixels of the image sensor being higher (image sensor having the area per one pixel is smaller than 6.1 (μm×μm)) than that of the 1/1.7 type image sensor having several mega pixels described above, the images sensor including an optical system having the allowable range of the focal deviation of ±several μm (e.g., ±3 μm).

Other Embodiments

The present technology is not limited to the embodiment described above, and various other embodiments may be implemented.

The case where a heat dissipation via is connected to a GND has been described above. For example, a heat dissipation via or the like that is connected to a signal terminal and transmits a signal may be provided. Further, a heat dissipation via that is connected to a GND and a heat dissipation via connected to a signal terminal may be provided in a mixed manner. In this case, an insulating heat dissipation sheet or the like is used so that the heat dissipation via is not short-circuited to another wiring or the GND. Alternatively, each heat dissipation via may be connected to a conductive heat dissipation sheet via an insulation film having high thermal conductivity.

The in-vehicle camera 1 has been described as an example of an in-vehicle device. The wiring module according to the present technology is applicable to an arbitrary in-vehicle device. For example, the wiring module may be applied to an electric circuit constituting a drive control system for controlling an automobile.

Fir example, heat dissipation vias each penetrating a board on which a device package such as a CPU is mounted are arranged in the board, a heat dissipation sheet or the like is connected to the rear surface of the board. As a result, it is possible to easily construct a heat-conductive path for connecting to the back side of the board. Further, the heat dissipation sheet may be connected to the front surface of the device package. As a result, a heat-conductive path is formed on both the front surface and the rear surface of the device package, and it is possible to significantly improve the heat dissipation efficiency. It goes without saying that the present technology is not limited to the device package to be mounted on an in-vehicle device and is applicable to an arbitrary device package.

The in-vehicle camera is applicable not only to automobile but also to various moving objects. Examples of the moving object to which the in-vehicle camera can be applied include an automobile, an electric car, a hybrid electric vehicle, a motorcycle, a bicycle, personal mobility, an airplane, a drone, a ship, a robot, construction machinery, and agricultural machinery (tractor).

Of the feature portions according to the present technology described above, at least two feature portions can be combined. That is, the various characteristic portions described in the respective embodiments may be arbitrarily combined without distinguishing from each other in the respective embodiments. Further, the various effects described above are merely illustrative and are not limitative, and may have an additive effect.

In the present disclosure, expressions such as "the same", "identical", and "perpendicular" include, in concept, expressions such as "substantially the same", "substantially identical", and "substantially perpendicular". For example, the expressions such as "the same", "equal", and "perpendicular" also respectively include states in predetermined ranges (such as a range of ±10%), with expressions such as "exactly the same", "exactly identical", and "perfectly perpendicular" being respectively used as references.

Note that the present technology may also take the following configurations.

(1) A wiring module, including:
a wiring board that includes a body portion and one or more heat dissipation vias, the body portion including a front surface layer to which a device package is connected and a rear surface layer opposite to the front surface layer, the one or more heat dissipation vias penetrating the body portion from the front surface layer to the rear surface layer; and
a heat dissipation member that is connected to the rear surface layer so as to thermally bond with the one or more heat dissipation vias.

(2) The wiring module according to (1), in which
the front surface layer has a connection region to which the device package is connected, and
the one or more heat dissipation vias are arranged immediately below the connection region.

(3) The wiring module according to (2), in which
the one or more heat dissipation vias are arranged immediately below a central portion of the connection region.

(4) The wiring module according to any one of (1) to (3), in which
the one or more heat dissipation vias are connected to a GND.

(5) The wiring module according to (4), in which
the wiring board includes a GND film that is formed on at least one of the front surface layer or the rear surface layer and is to be connected to at least part of the one or more heat dissipation vias.

(6) The wiring module according to (5), in which
the heat dissipation member is connected to the GND film formed on the rear surface layer.

(7) The wiring module according to any one of (1) to (6), in which
the device package has a terminal surface on which a plurality of connection terminals is arranged, each of the plurality of connection terminals being a signal terminal or a GND terminal, and
at least part of the one or more heat dissipation vias are arranged at positions immediately below the GND terminal of the plurality of connection terminals.

(8) The wiring module according to (7), in which
the one or more heat dissipation vias are arranged at positions other than the positions immediately below the signal terminals of the plurality of connection terminals.

(9) The wiring module according to (7) or (8), in which
the wiring board includes one or more signal vias to be electrically connected to the signal terminal.

(10) The wiring module according to (9), in which
a diameter of the heat dissipation via is set to a value equal to or larger than a diameter of the signal via.

(11) The wiring module according to any one of (1) to (10), in which
the wiring board is housed in a casing, and
the heat dissipation member is connected to each of the rear surface layer of the wiring board and the casing.

(12) The wiring module according to (11), in which
the casing includes an inner wall and a heat dissipation path provided to protrude from the inner wall, and
the heat dissipation member is connected to the heat dissipation path.

(13) The wiring module according to (12), in which
the casing houses a different wiring board to which a different heat dissipation member is connected, and
the heat dissipation member and the different heat dissipation member are connected to the heat dissipation path.

(14) The wiring module according to (12), in which
the casing houses a different wiring board to which a different heat dissipation member is connected, the heat dissipation member is connected to the heat dissipation path, and the different heat dissipation member is connected to a site of the inner wall away from a site in which the heat dissipation path is provided.

(15) The wiring module according to any one of (1) to (14), in which the heat dissipation member is a heat dissipation sheet.

(16) The wiring module according to any one of (1) to (15), in which the one or more heat dissipation vias are each be a filled via.

(17) The wiring module according to any one of (1) to (16), in which the device package is an imaging element package.

(18) The wiring module according to any one of (1) to (17) in which the wiring module constitutes an in-vehicle device to be mounted on a vehicle.

(19) An imaging apparatus, including:

an imaging element package; and a wiring module that includes a wiring board and a heat dissipation member, the wiring board including a body portion and one or more heat dissipation vias, the body portion including a front surface layer to which the imaging element package is connected and a rear surface layer opposite to the front surface layer, the one or more heat dissipation vias penetrating the body portion from the front surface layer to the rear surface layer, the heat dissipation member being connected to the rear surface layer so as to thermally bond with the one or more heat dissipation vias.

REFERENCE SIGNS LIST 1, 1a, 1b in-vehicle camera
10, 70 casing
12, 75 inner wall
13, 76 heat dissipation path
31 image sensor
32 wiring module
37 terminal surface
38 connection terminal
38a signal terminal
38b GND terminal
40 wiring board
41 heat dissipation sheet
42 board body
43 heat dissipation via
44 signal via
45 GND film
45a front-surface GND film
45b rear-surface GND film
50 front surface layer
51 rear surface layer
56 connection region
57 central portion
61, 81 different wiring board
64, 84 different heat dissipation sheet

What is claimed is:

1. A wiring module, comprising:
a first wiring board that includes a body portion and a plurality of heat dissipation vias, wherein
the body portion includes:
a front surface layer to which a device package is connected, and
a rear surface layer opposite to the front surface layer, and
the plurality of heat dissipation vias penetrates the body portion from the front surface layer to the rear surface layer; and
a first heat dissipation member that is connected to the rear surface layer to thermally bond with the plurality of heat dissipation vias, wherein an end of a first heat dissipation via of the plurality of heat dissipation vias is in contact with an end of the first heat dissipation member.

2. The wiring module according to claim 1, wherein
the front surface layer has a connection region to which the device package is connected, and
the plurality of heat dissipation vias is below the connection region.

3. The wiring module according to claim 2, wherein the plurality of heat dissipation vias is below a central portion of the connection region.

4. The wiring module according to claim 1, wherein the plurality of heat dissipation vias is connected to a ground (GND).

5. The wiring module according to claim 4, wherein
the first wiring board further includes a GND film on at least one of the front surface layer or the rear surface layer, and
the GND film is connected to a second heat dissipation via of the plurality of heat dissipation vias.

6. The wiring module according to claim 5, wherein the first heat dissipation member is connected to the GND film on the rear surface layer.

7. The wiring module according to claim 1, wherein
the device package has a terminal surface,
the terminal surface includes a plurality of connection terminals,
the plurality of connection terminals includes a signal terminal and a ground (GND) terminal, and
the first heat dissipation via of the plurality of heat dissipation vias is at first position below the GND terminal of the plurality of connection terminals.

8. The wiring module according to claim 7, wherein the first heat dissipation via of the plurality of heat dissipation vias is at the first position different from a second position below the signal terminal of the plurality of connection terminals.

9. The wiring module according to claim 7, wherein
the first wiring board further includes one or more signal vias, and
the one or more signal vias are electrically connected to the signal terminal.

10. The wiring module according to claim 9, wherein a diameter of the first heat dissipation via is set to a value equal to or larger than a diameter of a signal via of the one or more signal vias.

11. The wiring module according to claim 1, wherein
the first wiring board is in a casing, and
the first heat dissipation member is connected to each of the rear surface layer of the first wiring board and the casing.

12. The wiring module according to claim 11, wherein
the casing includes an inner wall and a heat dissipation path that protrudes from the inner wall, and
the first heat dissipation member is connected to the heat dissipation path.

13. The wiring module according to claim 12, wherein the casing houses a second wiring board to which a second heat dissipation member is connected, the second wiring board is different from the first wiring board, the second heat dissipation member is different from the first heat dissipation member, and the first heat dissipation member and the second heat dissipation member are connected to the heat dissipation path.

14. The wiring module according to claim 12, wherein the casing houses a second wiring board to which a second heat dissipation member is connected, the second wiring board is different from the first wiring board, the second heat dissipation member is different from the first heat dissipation member, the first heat dissipation member is connected to the heat dissipation path, and the second heat dissipation member is connected to a site of the inner wall away from a site that includes the heat dissipation path.

15. The wiring module according to claim 1, wherein the first heat dissipation member is a heat dissipation sheet.

16. The wiring module according to claim 1, wherein each heat dissipation via of the plurality of heat dissipation vias is a filled via.

17. The wiring module according to claim 1, wherein the device package is an imaging element package.

18. The wiring module according to claim 1, wherein the wiring module is in an in-vehicle device mounted on a vehicle.

19. An imaging apparatus, comprising:

an imaging element package; and a wiring module that includes a wiring board and a heat dissipation member, wherein the wiring board includes a body portion and a plurality of heat dissipation vias, the body portion includes:

a front surface layer to which the imaging element package is connected, and a rear surface layer opposite to the front surface layer, the plurality of heat dissipation vias penetrates the body portion from the front surface layer to the rear surface layer, the heat dissipation member is connected to the rear surface layer to thermally bond with the plurality of heat dissipation vias, and an end of a heat dissipation via of the plurality of heat dissipation vias is in contact with an end of the heat dissipation member.

\* \* \* \* \*